United States Patent
Uzoh et al.

(10) Patent No.: US 9,142,508 B2
(45) Date of Patent: Sep. 22, 2015

(54) SINGLE EXPOSURE IN MULTI-DAMASCENE PROCESS

(75) Inventors: Cyprian Uzoh, San Jose, CA (US); Vage Oganesian, Palo Alto, CA (US); Ilyas Mohammed, Santa Clara, CA (US); Craig Mitchell, San Jose, CA (US); Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 13/170,095

(22) Filed: Jun. 27, 2011

(65) Prior Publication Data

US 2012/0326313 A1  Dec. 27, 2012

(51) Int. Cl.
| | | |
|---|---|---|
| *H01L 23/52* | (2006.01) | |
| *H01L 23/528* | (2006.01) | |
| *H01L 23/532* | (2006.01) | |
| *H01L 21/768* | (2006.01) | |

(52) U.S. Cl.
CPC ...... *H01L 23/5283* (2013.01); *H01L 21/76807* (2013.01); *H01L 21/76885* (2013.01); *H01L 23/53209* (2013.01); *H01L 23/53238* (2013.01); *H01L 23/53252* (2013.01); *H01L 21/76834* (2013.01); *H01L 21/76852* (2013.01); *H01L 2221/1036* (2013.01)

(58) Field of Classification Search
CPC ................ H01L 2924/00; H01L 2224/73265; H01L 21/76897; H01L 33/642
USPC ............ 438/638, 639, 667, 622; 257/99, 415, 257/288, 316, 71
See application file for complete search history.

(56) References Cited

U.S. PATENT DOCUMENTS

| | | | | |
|---|---|---|---|---|
| 5,795,823 A * | 8/1998 | Avanzino et al. | ............ | 438/639 |
| 5,922,477 A * | 7/1999 | Hoyt et al. | ................. | 428/596 |
| 6,187,215 B1 * | 2/2001 | Hoyt et al. | ..................... | 216/94 |
| 6,417,095 B1 * | 7/2002 | Chen | ............................. | 438/633 |
| 6,468,439 B1 * | 10/2002 | Whitehurst et al. | ............ | 216/95 |
| 6,825,562 B2 * | 11/2004 | Naik et al. | .................... | 257/758 |
| 6,894,390 B2 * | 5/2005 | Schammler et al. | ......... | 257/738 |
| 7,141,507 B2 * | 11/2006 | Genz et al. | .................... | 438/719 |
| 7,601,607 B2 * | 10/2009 | Liu et al. | ....................... | 438/424 |
| 7,811,926 B2 * | 10/2010 | Fuller et al. | ................... | 438/622 |
| 8,076,780 B2 * | 12/2011 | Saigoh et al. | ................ | 257/760 |
| 8,093,150 B2 * | 1/2012 | Beck et al. | .................... | 438/638 |
| 8,198,190 B2 * | 6/2012 | Richter et al. | ................ | 438/622 |
| 8,232,198 B2 * | 7/2012 | Lin | ................................ | 438/637 |
| 8,368,214 B2 * | 2/2013 | Tam et al. | ..................... | 257/738 |
| 8,410,605 B2 * | 4/2013 | Hart | ............................. | 257/738 |
| 2003/0062627 A1 * | 4/2003 | Naik et al. | .................... | 257/774 |
| 2005/0196952 A1 * | 9/2005 | Genz et al. | .................... | 438/622 |
| 2006/0202249 A1 * | 9/2006 | Cheng et al. | ................. | 257/301 |

(Continued)

*Primary Examiner* — Jaehwan Oh
(74) *Attorney, Agent, or Firm* — Haynes and Boone, LLP

(57) ABSTRACT

Methods of fabricating a multi-layer semiconductor device such as a multi-layer damascene or inverted multi-layer damascene structure using only a single or reduced number of exposure steps. The method may include etching a precursor structure formed of materials with differential removal rates for a given removal condition. The method may include removing material from a multi-layer structure under different removal conditions. Further disclosed are multi-layer damascene structures having multiple cavities of different sizes. The cavities may have smooth inner wall surfaces. The layers of the structure may be in direct contact. The cavities may be filled with a conducting metal or an insulator. Multi-layer semiconductor devices using the methods and structures are further disclosed.

10 Claims, 13 Drawing Sheets

(56) References Cited

U.S. PATENT DOCUMENTS

| | | | |
|---|---|---|---|
| 2007/0178410 A1* | 8/2007 | Shih et al. | 430/311 |
| 2007/0264820 A1* | 11/2007 | Liu et al. | 438/624 |
| 2008/0070404 A1* | 3/2008 | Beck et al. | 438/638 |
| 2009/0008783 A1* | 1/2009 | Saigoh et al. | 257/760 |
| 2009/0226611 A1* | 9/2009 | Suzuki et al. | 427/250 |
| 2010/0136781 A1* | 6/2010 | Kulkarni et al. | 438/622 |
| 2011/0084313 A1* | 4/2011 | Witters et al. | 257/204 |
| 2012/0074536 A1* | 3/2012 | Beck et al. | 257/635 |
| 2012/0205818 A1* | 8/2012 | Lin | 257/774 |

* cited by examiner

SINGLE EXPOSURE IN MULTI-DAMASCENE PROCESS

INCORPORATION BY REFERENCE

All publications, including patents and patent applications, mentioned in this specification are herein incorporated by reference in their entirety to the same extent as if each individual publication was specifically and individually indicated to be incorporated by reference.

BACKGROUND OF THE INVENTION

1. Field of the Invention

This invention relates, in general, to semiconductor manufacturing, and more particularly the invention typically relates to multi-damascene structures and methods for their fabrication.

2. Description of the Related Art

One of the primary challenges in the production of semiconductor devices involves the ability to create circuits of increasing density with smaller and smaller critical dimensions. As devices become smaller and have higher resolution, production costs become a greater concern, especially at the sub-micron level and smaller.

One type of conventional semiconductor manufacturing method is the damascene process. The damascene semiconductor processing method differs from conventional semiconductor processing methods in that the metal lines are not etched. Rather, the metal conductor is deposited in grooves formed within a dielectric layer. Excess metal is then removed by chemical mechanical polish (CMP) techniques and other techniques. In general, a single damascene process involves lithographic patterning, trench or hole imaging, gap filling with conductor, and then CMP. A dual damascene process typically involves repeating the damascene structure for one layer having a hole and another layer having a trench, and then simultaneously filling both the trench and the hole with metal.

The damascene process and the dual damascene process are popular for laying metal lines and interconnects on chips. An advantage of the damascene process is that the many of the processing problems associated with metal etch steps, including corrosion, resist burn, and time critical with resist are reduced. This is due in part to the use of lithographic patterning. Lithography processes, however, typically drive up the overall cost of the production process significantly.

Semiconductor manufacturing techniques typically involve several costly lithography steps. Conventional industry approaches utilize more than one ILD layer or etch stop to pattern the insulative layer. These approaches employ two separate lithographic and RIE steps to create a dual damascene cavity profile. Additional lithographic and material removal processes are required for each additional layer. The production complexity also increases exponentially with additional layers.

The lithographic imaging step is one of the most expensive steps in the device fabrication process. Also, the two RIE material removal steps add additional cost and complexity to dual damascene process.

Accordingly, there is a need for a method to create a multi-layer damascene pattern on a substrate with reduced complexity and costs. What is needed is a device and methods which overcome the above and other disadvantages.

SUMMARY OF THE DISCLOSURE

In summary, one aspect of the present invention is directed to a precursor structure for a process to form a multi-damascene structure having cavities with different widths with a single exposure, the precursor structure includes a semiconductor substrate; a pre-metal first layer of dielectric material above the substrate; and a pre-metal second layer of dielectric material adjacent to and above the first layer. In various embodiments, the pre-metal first and second layers of dielectric material have a thickness greater than 300 nm.

In various embodiments, the second layer has a different removal rate than the first layer for a given material removal process. In various embodiments, the given removal process is reactive ion etching.

In various embodiments, the first layer and second layer each comprise a low dielectric constant material with a dielectric constant not exceeding 3.5. In various embodiments, the first layer and second layer are the same material. In various embodiments, the first layer and the second layer are different materials. In various embodiments, the first layer and the second layer have different thicknesses.

In various embodiments, the first layer is selected to have a removal rate more or less anisotropic than the removal rate of the second layer.

In various embodiments, the structure further includes a mask overlying the second layer, the mask including a resist material and having a pattern exposing a portion of the second layer. The structure may include an etch stop layer between the first layer and the second layer. In various embodiments, the first and second layers are in direct contact with one another without an interlayer dielectric between the layers.

Various aspects of the invention are directed to a multi-damascene structure formed by a single exposure process, including a semiconductor substrate; a first insulator layer of dielectric material above the substrate including a first cavity; and a second insulator layer of dielectric material above the first layer. In various embodiments, the second layer includes a second cavity open to the first cavity and having a different width than the first cavity. In various embodiments, the second layer has a different removal rate than the first layer for a given material removal process.

In various embodiments, the second layer is in direct contact with the first layer without an intermediate etch stop layer. In various embodiments, the entire second layer is in direct contact with the first layer without an intermediate etch stop layer. In various embodiments, the second layer is in direct contact with the first layer in a region adjacent the first and second cavities.

In various embodiments, each of the first and second layers comprise a plurality of cavities. In various embodiments, the structure includes a conductor filling the cavities. The conductor may be a member selected from the group consisting of stainless steel, aluminum, gold, indium, gallium, tin, copper, tungsten, nickel, cobalt, molybdenum, solder, and an alloy of the same. In various embodiments, each of the insulator layers has a dielectric constant less than 3.5. In various embodiments, the first layer, the second layer, and an area between the layers is substantially free of silicon dioxide.

Various aspects of the invention are directed to a multi-damascene structure, including a semiconductor substrate; and an insulator layer of essentially homogenous dielectric material on the substrate having a cavity. In various embodiments, the cavity has essentially concave vertical walls. A maximum width of the cavity may be between a top surface and a bottom surface of the insulator layer.

In various embodiments, the insulator layer is essentially free of silicon dioxide. In various embodiments, the includes another insulator layer of dielectric material overlying a top surface of the layer, the another insulator layer having another cavity. The another cavity may have essentially concave vertical walls. The layer and the another layer may be in contact without an intermediate etch stop layer. A maximum width of the another cavity may be below a top surface of the another layer and above the top surface of the layer.

In various embodiments, the cavity is a line and the another cavity is a via, the line and the via being vertically aligned. The structure may include a third layer overlying the another layer, the third layer having a line vertically aligned over the via. The another cavity may be wider than the cavity.

In various embodiments, the structure includes a barrier layer coating an interior of the cavity. In various embodiments, the structure includes a conductor substantially filling the cavity, the another cavity, and a combination of the same. In various embodiments, the layer and the another layer are separated by an etch stop layer comprising a material resistant to etching.

Various aspects of the invention are directed to a multi-damascene structure including a substrate; a first insulator layer comprising a dielectric material including a first gap filled with a conductor; a second insulator layer comprising a dielectric material including a second gap filled with the conductor, the second insulator being stacked on the first insulator layer such that the second gap is vertically aligned with the first gap; an intermediate member comprising a material resistant to etching disposed between the insulator layers, the intermediate member comprising an opening aligned with the first and second gaps; and a seed material coating the intermediate member.

In various embodiments, the seed material coats a portion of the intermediate member adjacent the opening and extending over the first and second gaps. The seed material and the conductor may be the same material. The seed material may be a member selected from NiB, NiW, TaN/NiB alloy, TaN/NiW alloy, TaN, TaN/Ta alloy, TiN, CoP, and combinations of the same. The structure may include seed material coating an under region of the substrate.

Various aspects of the invention are directed to a multi-damascene structure formed by a single exposure lithography process, including a semiconductor substrate; a first metal layer above the substrate having a first cavity; and a second metal layer above the first layer, the second layer including a second cavity open to the first cavity and having a different width than the first cavity. In various embodiments, the second layer has a different removal rate than the first layer for a given material removal process. In various embodiments, the second layer is in direct contact with the first layer without an intermediate etch stop layer.

In various embodiments, the structure includes an insulator filling at least one of the first and second cavities. In various embodiments, the first layer and second layer each have a thickness greater than 300 nm. The entire second layer may be in direct contact with the first layer without an intermediate etch stop layer. The first metal layer and second metal layer may be aluminum. The first metal layer and second metal layer may be formed of the same metal. The first cavity may be wider than adjacent portions of the first metal layer defining the first cavity.

Various aspects of the invention are directed to an interconnect structure, including a substrate; a first conductor over the substrate having a first width; and a second conductor over the first conductor having a second width different than the first width. In various embodiments, the first and second conductors are embedded within a dielectric material layer over the substrate. In various embodiments, the structure includes a conducting barrier layer over portions of both the first and second conductors. In various embodiments, the dielectric material comprises a porous material. In various embodiments, the dielectric material has a dielectric constant of less than 2.5. In various embodiments, the dielectric material defines an air gap. In various embodiments, the structure includes an insulating conformal layer over portions of both the first and second conductors.

Yet another aspect of the present invention is directed to an integrated circuit semiconductor device having a semiconductor body with a plurality of active devices and multilevel interconnections with metal contacts disposed on the semiconductor body for electrically connecting the active devices to each other through the multilevel interconnection and the metal contacts and with at least one level of interconnection. In various embodiments, the device comprises a semiconductor substrate, a first insulator layer of dielectric material above the substrate including a first cavity, and a second insulator layer of dielectric material above the first layer, the second layer including a second cavity open to the first cavity and having a different width than the first cavity. The second layer may have a different removal rate than the first layer for a given material removal process. The second layer may be in direct contact with the first layer without an intermediate etch stop layer. Various aspects of the invention are directed to a device comprising any of the features described with respect to the aspects and embodiments described above.

Various aspects of the invention are directed to a method of fabricating a damascene structure with a single exposure, including forming a pre-metal first layer of dielectric material on a semiconductor substrate; forming a pre-metal second layer of dielectric material on the first layer; patterning a lithographic mask over the second layer; removing material from the second layer to form one or more cavities using the mask; and removing material from the first layer using the same mask to form one or more cavities.

In various embodiments, the removing of the first layer is performed at a different rate than the removing of the second layer. In various embodiments, the removing of the first layer is performed under conditions such that the one or more cavities formed in the first layer have a different width than the one or more cavities formed in the second layer.

In various embodiments, the removing of the first and second layers include wet etching. The removing of the second layer may be more isotropic than the removing of the first layer. The removing of the second layer may be less isotropic than the etching of the first layer. In various embodiments, the first and second layers having different removal rates with respect to a given chemical etching recipe. In various embodiments, the removing of the first layer is faster than the removing of the second layer to create an undercut structure in the first layer below the second layer.

In various embodiments, the removing of the first layer starts a predetermined period of time after the removing of the second layer begins. The predetermined period of time may correspond to the time to etch through substantially the entire thickness of the second layer.

In various embodiments, the method includes applying an etch stop layer between the first layer and the second layer prior to the removing of the second layer.

In various embodiments, the method includes, prior to the etching of the second layer, forming one or more additional pre-metal layers of dielectric material stacked on the second layer; and forming a damascene structure by a repeating process of patterning respective lithographic masks and etching the one or more additional layers using the respective masks. The forming may include alternately patterning lithographic masks and etching. A number of times the patterning of respective masks is performed may be equal to or less than a number of the additional layers formed.

In various embodiments, the method includes, after the removing of the first layer, applying a metal layer over the second layer; and forming one or more patterned stacked metal layers on the second layer. The patterned metal may be separated by dielectric material.

In various embodiments, the removing of the first layer and the removing of second layer are performed essentially continuously using the same mask.

In various embodiments, the forming of the second layer comprises applying dielectric material directly on the first layer without an interlayer dielectric.

Various aspects of the invention are directed to a method of fabricating a multi-layer damascene structure, including coating a patterned structure with a barrier layer, and filling the cavity with a conductor fill material.

In various embodiments, the patterned structure includes a plurality of dielectric layers having a cavity, the layers being stacked on a substrate; and an etch mask on a top surface of the dielectric layers, a portion of the etch mask extending above the cavity. In various embodiments, wherein the barrier layer covers an interior of the cavity.

In various embodiments, the etch mask is configured to act as a planarization stop. In various embodiments, the method includes planarizing the structure using the etch mask after the cavity filling. The method may include adding stacked metal layers on the etch mask, the stacked metal layers each comprising patterned metal separated by an insulator.

In various embodiments, the barrier layer substantially covers the exposed surfaces of the etch mask and dielectric layers. The coating with a barrier layer may include coating with a wet process. The method may include thermally stabilizing the conductor after the filling. The thermal stabilizing may include annealing the conductor.

In various embodiments, the coating includes applying a material selected from NiB, NiW, TaN/NiB alloy, TaN/NiW alloy, TaN, TaN/Ta alloy, TiN, CoP, or combinations of the same. The coating may be performed by sputtering, atomic layer deposition, or electroless deposition.

In various embodiments, the conductor fill material is copper. In various embodiments, the filling comprises forming an essentially continuous conductor layer over the dielectric layers. In various embodiments, the method includes patterning an image on the continuous conductor layer with resist material; and etching the image into the conductor layer to form a patterned conductor layer. In various embodiments, the method includes, prior to the patterning on the continuous conductor layer, planarizing the conductor to form an essentially flat conductor layer. The method may include coating the patterned conductor layer with a protective layer of material.

Various aspects of the invention are directed to a method of fabricating a damascene structure, including forming a first metal layer on a semiconductor substrate; forming a second metal layer on the first layer; patterning a lithographic mask over the second layer; removing material from the second layer to form one or more cavities using the mask; and removing material from the first layer using the same mask to form one or more cavities. In various embodiments, the removing of the first layer is performed at a different rate than the removing of the second layer.

In various embodiments, the removing material from the second layer is performed under different conditions than the removing material from the first layer. The first metal layer and the second metal layer may include copper. The method may include filling the first and second cavities with an insulator material.

Various aspects of the invention are directed to a method of fabricating semiconductor device including any of the processes and operations described with respect to the methods described above.

The methods and devices of the present invention have other features and advantages which will be apparent from or are set forth in more detail in the accompanying drawings, which are incorporated in and form a part of this specification, and the following Detailed Description, which serve to explain the principles of the present invention.

BRIEF DESCRIPTION OF THE DRAWINGS

FIG. 4A is a cross-sectional view of a precursor structure for forming a dual-damascene structure with a single exposure process in accordance with aspects of the invention. FIG. 4B is a cross-sectional view of the precursor structure of FIG. 4A with a lithographic image and resist material over a top surface. FIG. 4C is a cross-sectional view of the structure of FIG. 4B after the image has been transferred to the resist and a cavity has been formed in the top insulator layer using the resist. FIG. 4D is a cross-sectional view of the structure of FIG. 4C after a second cavity has been formed in the bottom insulator layer using the same resist. FIG. 4E is an enlarged cross-sectional view of a portion of the structure of FIG. 4D, illustrating a resulting cavity in the top and bottom insulator layers.

DETAILED DESCRIPTION

Figure 1A:
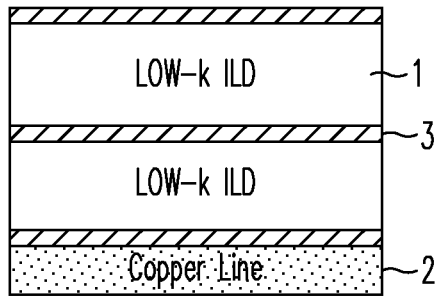
FIGS. 1a to 1f are sequential cross-sectional views of a dual-damascene structure produced by a conventional trench-first process.

Reference will now be made in detail to exemplary embodiments of the invention, which are illustrated in the accompanying drawings. While aspects of the invention will be described in conjunction with the exemplary embodiments, it will be understood that they are not intended to limit the invention to those embodiments. On the contrary, the invention is intended to cover alternatives, modifications and equivalents, which may be included within the spirit and scope of the invention as defined by the appended claims.

For convenience in explanation and accurate definition in the appended claims, the terms "up" or "upper", "down" or "lower", "inside" and "outside" are used to describe features of the present invention with reference to the positions of such features as displayed in the figures. In many respects the embodiments of some figures resemble those of various other figures and similar reference numerals designate corresponding parts.

Unless expressly stated otherwise, the terms used herein are to be understood as used by one of ordinary skill in the art, and in various respects, the semiconductor and computer fields. Use of the singular in connection with the terms herein generally includes the plural and vice versa.

The present invention generally relates to the fabrication of metal conductive lines and vias that provide the interconnection of integrated circuits in semiconductor devices and/or the interconnections in a multi-layer substrate on which semiconductor device(s) are mounted. Various aspects of the invention relate to the fabrication of conductive lines and vias by a process known as damascene. Various aspects of the invention relate to fabrication of novel multi-layer damascene structures for use in an integrated circuit, micro-electro-mechanical (MEM) device, a memory device, and the like.

Figure 2A:
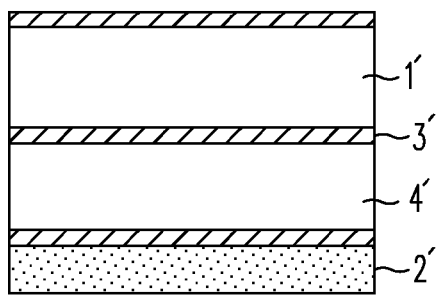
FIGS. 2a to 2f are sequential cross-sectional views of a dual-damascene structure produced by a conventional via-first process.
Figure 2B:
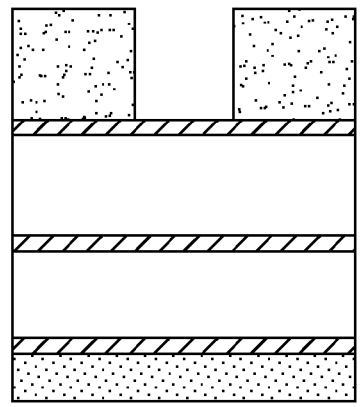
Figure 2C:
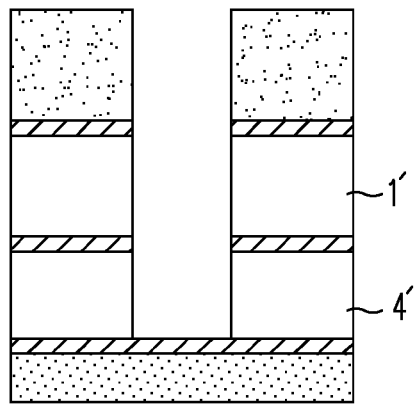
Figure 2D:
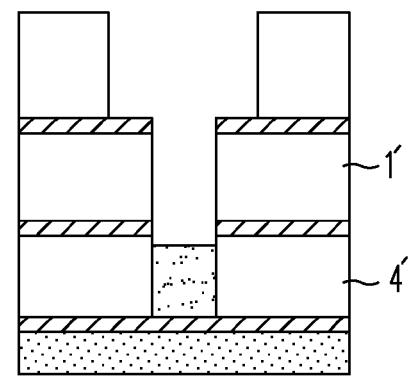
Figure 2E:
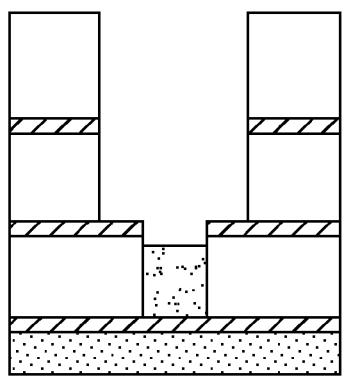
Figure 2F:
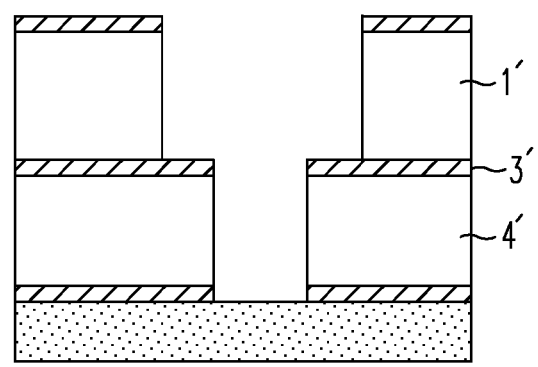
Figure 3:
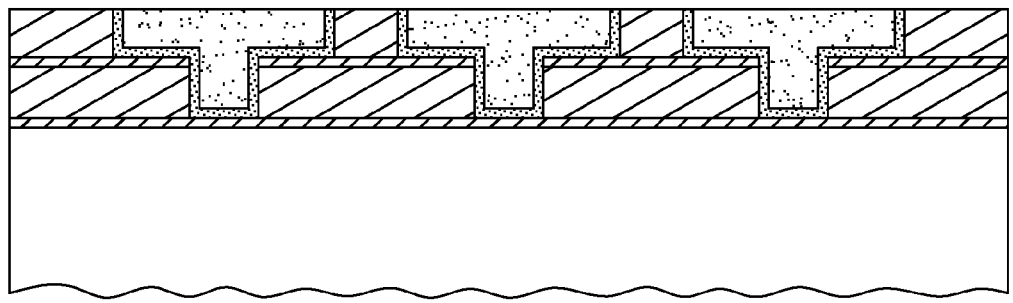
FIG. 3 is a cross-sectional view of a dual-damascene structure plated with metal and planarized by CMP methods.

FIGS. 1 to 3 illustrate two basic approaches for creating a dual damascene structure: via-first and trench-first. With the via-first approach, there is typically an intermediate etch-stop layer between the top and bottom intermetallic dielectric (IMD) layers for better via critical dimension (CD) control. This intermediate layer is typically formed with a material of high etching resistance or selectivity relative to the IMD material. The intermediate layer usually also has a higher dielectric constant. The higher dielectric constant, however, has a deleterious effect on the speed of the fabricated device. Nonetheless, the intermediate layer cannot be removed because poor via profile may be observed without the use of the intermediate layer. This may also be a problem for CD control as the device shrinks in size.

Figure 1B:
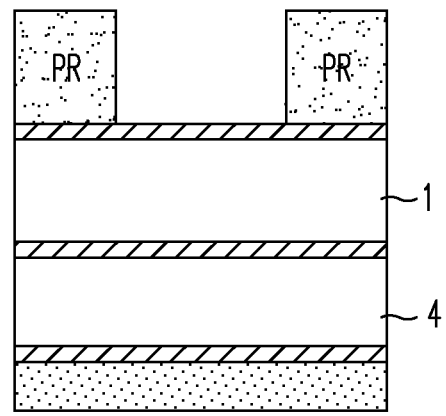
Figure 1C:
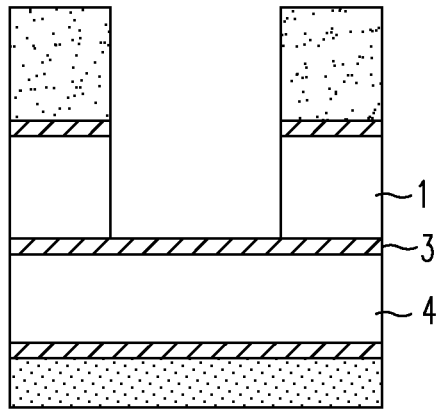

FIGS. 1a-1f illustrate an exemplary trench first process. In the trench first process, a sufficiently thick insulator 1 is coated on a substrate 2 of interest. The insulator may be separated with an inter layer dielectric material 3 (ILD) as shown in FIG. 1a. The top layer of insulator 1 is coated with known resist materials. Next the material is lithographically exposed with a trench image. The material is patterned with the desirable image as illustrated in FIG. 1b. The resist image is transferred to the top portion of the insulating layer by RIE methods in some embodiments to create a trench cavity in top insulator 1 as depicted in FIG. 1c.

Figure 1D:
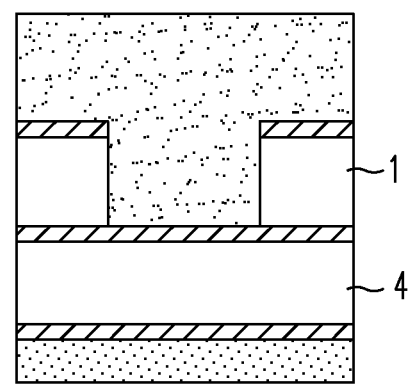
Figure 1E:
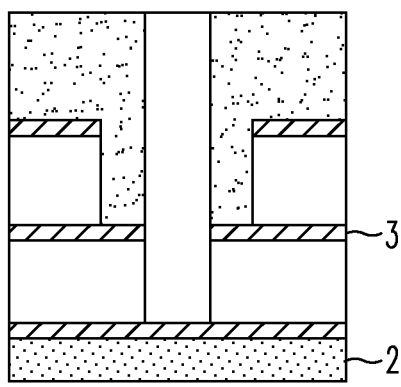
Figure 1F:
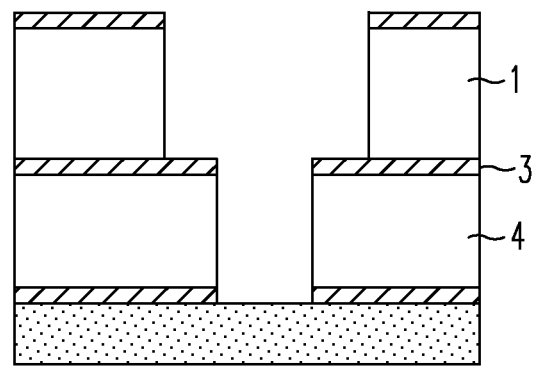

After patterning the insulator layer, the patterned substrate is cleaned and recoated with resist material as shown in FIG. 1d. In FIG. 1e, the patterned substrate is then lithographically exposed for a second time with via image developed by known methods. The via image is transferred to a bottom insulating layer 4 to create a lower cavity as depicted in FIG. 1f. The patterned substrate is then cleaned again. Next the structure is coated with a suitable barrier layer or seed layer. Thereafter the dual cavity is filled with a suitable metal such as copper using electrochemical methods. The metal coated substrate is planarized to remove the unwanted metals and achieve a smooth top surface. FIG. 3 illustrates an exemplary finished structure.

The major disadvantage of the trench first approach is that the second time resist material is applied (shown in FIG. 1d), it is thicker in the via. This tends to be problematic for imaging depth of field and depth of focus among others issues. Hence, it can be difficult to produce images with very high fidelity and accuracy.

In the via first approach, the patterning step is reversed. FIG. 2a illustrates a substrate 2' with two insulator layers 1' and 4' separated by ILDs 3'. In FIG. 2b substrate 2' is coated with a suitable resist material and patterned with the via image. The image of the via is then etched into the insulator by RIE methods as shown in FIG. 2c.

The via patterned substrate is cleaned and coated with fresh resist material for a second lithography step. The patterned substrate is then lithographically exposed for a second time with a trench or line image as shown in FIG. 2d. The trench image is transferred by RIE methods to create a trench cavity in top insulator 1' as depicted in FIG. 2e. The patterned substrate is then cleaned and prepared for subsequent process step.

Various aspects of the invention relate to a fabrication process and resulting damascene structures that reduce the number of lithography exposure steps. In one embodiment shown in FIGS. 4A, 4B, 4C, and 4D, an exemplary precursor structure generally designated 30 is adapted for fabricating a multi-damascene structure. In some respects the resulting multi-damascene structure is similar to the structure shown in FIG. 3. Aspects of the resulting multi-damascene structure are similar to the structures disclosed by U.S. Publication Nos. 2006/0134898 to Abbott and 2002/0090576 to Tu, the entire contents of which patents and publications are incorporated herein for all purposes by this reference.

As used herein, "precursor" refers generally to structure or materials that precede another structure in a fabrication process. In various respects, "precursor" refers to structure or materials that are configured to result in a particular structure. For example, a precursor structure may include a structure with particular configurations or adaptations that inform a fabrication process and/or yield a predetermined resulting structure. One of skill in the art, and in various respects the semiconductor art, will understand from the description herein that there are many ways to create, adjust, and modify a precursor structure in accordance with aspects of the invention.

Various aspects of the invention relate to a method that utilizes a single photolithography exposure step to fabricate a multi-damascene structure. The methods in accordance with aspects of the present invention may include coating two or more dielectric layers on a substrate. In various embodiments, this may be accomplished by patterning dielectric laminate material comprising at least one type of dielectric film stack and using physical and/or process parameters to create a multi-damascene pattern with different sized cavity structures. In various embodiments, the physical parameters include selecting insulator materials with predetermined, differential etch rates thereby leading to a damascene pattern profile. In various embodiments, the damascene structure is fabricated by removing material from the material layers under a different removal profiles.

FIGS. 4A, 4B, 4C, and 4D illustrate an exemplary process for fabricating a multi-damascene structure from a precursor structure 30. Exemplary precursor structure 30 comprises a semiconductor substrate 32 and an insulator stack generally designated 34. Exemplary insulator stack 34 includes two insulator layers. Although described in terms of a two-layer insulator stack, one will appreciate that the structure may include three or more insulator layers.

Figure 4A:
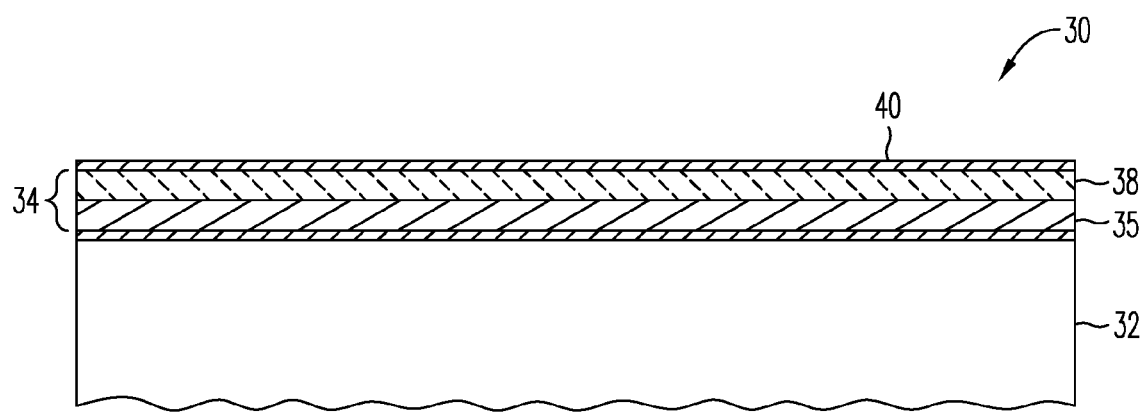
FIGS. 4A to 4E are sequential cross-sectional views of a dual-damascene structure produced in accordance with aspects the invention.

Focusing on FIG. 4A, exemplary precursor structure 30 includes a bottom or first layer 35 above substrate 32 and a second layer 38 above first layer 35. In an exemplary embodiment, the second layer is adjacent to the first layer. The second layer may be physically or chemically separated from the first layer. For example, the structure may include an inter-level or inter-layer dielectric (ILD) or other material between the first and second layers. Layers 35 and 38 are generally differentiated from other materials in the device by their physical, electrical, and/or chemical properties. In various embodiments, the second layer is directly adjacent to or in direct contact with the first layer. All or a portion of the layers may be in contact with each other.

Exemplary layers 35 and 38 are pre-metal insulator layers. The layers as shown in the state shown in FIG. 4A are referred to generally as "pre-metal" because they have not yet undergone filling with a conductor fill material (shown, e.g., FIG. 5).

Each of exemplary insulator layers 35 and 38 comprises a dielectric material. In various embodiments, the insulator layer is substantially free of silicon dioxide ($SiO_2$). The exemplary insulator layers each have a dielectric constant equal to or less than 3.5. In various embodiments, the insulator layer dielectric constant is less than 5, less than 4.5, less than 4, less than 3.5, or less than 3. In various embodiments, the insulator layer has a variable dielectric constant. For example, one portion of the insulator layer may be configured to have a higher or lower dielectric constant than the remainder of the insulator layer.

Exemplary insulator layers 35 and 38 are each greater than 300 nm thick. In various embodiments, the insulator layer thickness is greater than 100 nm, greater than 200 nm, greater than 300 nm, greater than 350 nm, or greater than 500 nm. By contrast, inter-layer separators are typically relatively thinner, generally between about 20 nm and about 100 nm. By example, the inter-layer dielectric (ILD) shown in FIGS. 1 and 2 is significantly thinner than 100 nm. In various embodiments, the thickness of the insulator layer varies over its surface. As used herein, the thickness and other properties of the insulator generally refer to a property in at least a local region of interest.

With continued attention to FIG. 4A, precursor structure 30 may be configured for a damascene process with a reduced number of exposure steps compared to conventional structures and damascene processes. The exemplary precursor structure is configured to produce a dual-damascene structure with only a single exposure step. In particular, exemplary first layer 35 and exemplary second layer 38 are each configured with different removal rates and/or removal profiles.

In various embodiments, the first layer and second layer are different materials. In various embodiments, the first layer and second layer have different material removal characteristics. In various respects "material removal" and "etch" are used interchangeably. "Material removal characteristics" may refer to removal rate, removal profile, anisotropy, and other characteristics for a given process which would be understood by one of skill in the art.

"Removal rate" is to be understood as generally used in the semiconductor art and in various respects refers to a rate of material removal for a given process. For example, subjecting exemplary first layer 35 and second layer 38 to the same process under the same conditions and with everything else being equal, the material in one of the layers will be removed at a faster rate than the other. In various embodiments, the layers are formed of different materials. The materials may be selected so the layers are etched at different rates. Put another way, the exemplary layers have different etch profiles under a fixed, given etching condition. Although described in terms of etching, one will appreciate that the structures and processes described can be used with other removal processes. Suitable removal processes include, but are not limited to, wet etching, dry etching and mechanical removal processes, light-based removal processes. Suitable dry removal processes include, but are not limited to, reactive ion etching (RIE) and ultraviolet (UV) exposure.

In one embodiment, exemplary first layer 35 and second layer 38 are configured to have different etch rates for a given material removal process. In an exemplary case, the layers exhibit different etch rates under a given reactive ion etching (RIE) process. The etch rate for the top layer 38 may be more or less isotropic than the bottom layer 35. In another example, the top insulator may exhibit a relatively isotropic removal profile while the bottom insulator may exhibit a comparatively more anisotropic removal profile or vice versa. In another example, the layers may exhibit anisotropic removal profiles while having different removal rates.

With continued reference to FIG. 4A, in exemplary precursor structure 30, first layer 35 has a relatively lower removal rate than second layer 38. As will be apparent from the description below, this precursor structure configuration influences or controls the removal process. When subjected to a typical given removal process, a multi-damascene structure having a different sized cavity in each layer results.

Although described in terms of an exemplary insulator stack 34, one will appreciate that the same principles can be equally applied to a precursor structure utilizing a metal stack. An example of a process for forming a multi-damascene structure from a metal precursor structure will be described below.

With reference to FIGS. 4A, 4B, 4C, and 4D generally, a method of forming a damascene structure from precursor structure 30 will now be described in greater detail. As shown in FIG. 4A, a resist 40 is deposited on a top surface of second layer 38. Exemplary resist 40 is a photoresist material. In the case of an etching process, "resist" is generally used interchangeably with "etch stop" or "etch stop layer."

Figure 4B:
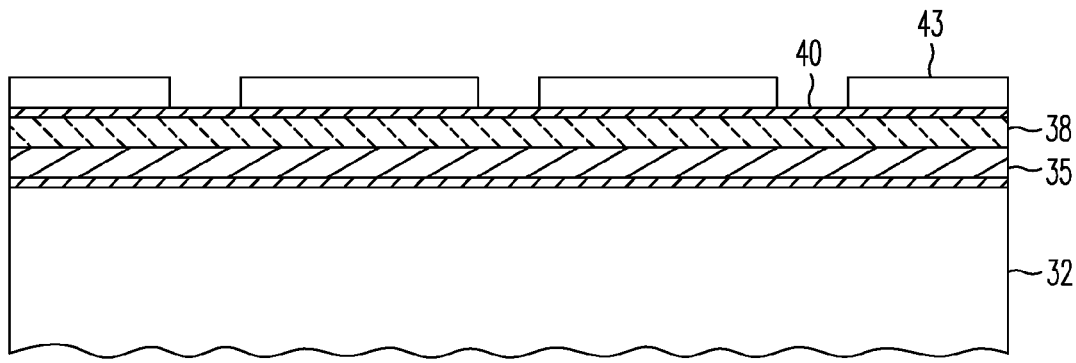

Next, a lithographic mask 43 is used to transfer an image to resist 40. As shown in FIG. 4B, only a single mask or resist covers first layer 35, second layer 38, and substrate 32. Exemplary mask 43 is a lithography mask. A lithography process transfers a pattern from the mask to the resist as shown in FIGS. 4A and 4B. In various respects, "mask" is used generally to describe the patterned resist material. In various respects "resist" is used somewhat interchangeably with "mask" and "resist mask."

After patterning the structure with a suitable resist as shown in FIG. 4B, the structure is subjected to a removal process using the resist mask. The material removal process may include any type of material subtraction method as understood in the art. The removal process may be performed in a single step or multiple steps. In an exemplary embodiment, material is removed from both layers in multiple steps using the same resist mask.

Figure 4C:
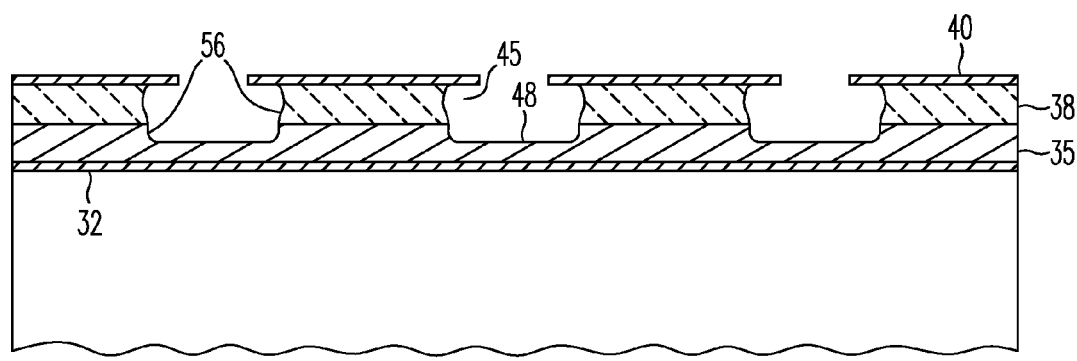
Figure 4D:
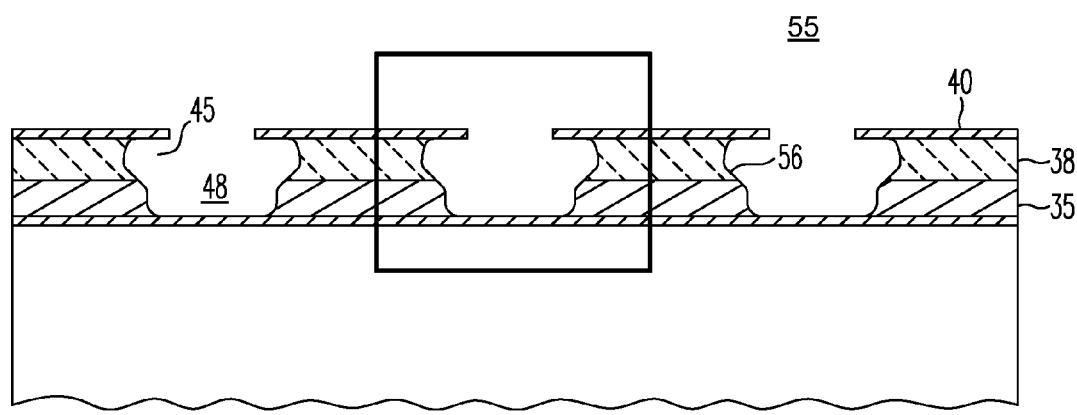

In an exemplary embodiment, the removal process is reactive ion etching (RIE). The structure is subjected to a removal process to create a trench or cavity 45 in second layer 38. In an exemplary embodiment, the removal process conditions are selected to create an undercut structure in layer 38 below resist 40 as shown in FIGS. 4C and 4D. As shown in FIG. 4C, the removal process to create a cavity in second layer 38 may also partially remove material from first layer 35 (best seen in FIG. 4C). This occurs in part because the structure does not include a barrier material or etch stop to prevent the removal process from working on the second layer. This does not occur in traditional structures that employ an inter-layer etch stop. After forming a top cavity 45, the removal process continues to create a bottom cavity 48 in first layer 35 as shown in FIG. 4D.

In various embodiments, the material removal process conditions are selected to change the material removal rate and/or profile. As will be understood by one of skill from the description herein, the shape and size of the cavities formed in the material layers may be controlled by the process conditions. For example, the material removal process may proceed for a longer time to remove more material. The conditions may be adjusted to change the rate at which material is removed. In one embodiment, the material removal process is a wet etching process and the etch recipe for the first layer is different than the etch recipe for the second layer. For example, the etch recipe may be changed to remove more material in the same amount of time. One will appreciate other manner for adjusting the material removal profile.

In various embodiments, the first layer and second layer are identical materials. In various embodiments, the first layer and second layer are nearly identical materials. In various embodiments, the fabrication method includes removing material from upper second layer 38 at a different rate than the removing of material from lower first layer 35. In this manner a dual-damascene structure may be formed based on adjustment of the material removal conditions.

The process conditions may be configured to create structures of varying complexity, shape, and style. In various embodiments, the material removal process proceeds under a first predetermined set of conditions and then changes to a second set of conditions upon receiving a signal. The signal may be based on elapsed time or a particular event. For example, the process may switch to a second set of conditions after an elapsed period of time based on the estimated time to etch through uppermost layer 38. The process may switch after the system receives confirmation that the etching has penetrated the top layer and lower layer 35 has been reached. This may be accomplished using known techniques such as impedance monitoring or the addition of markers between the two layers. The material removal process for the first layer may occur immediately after the removal process of the second layer or after a delay. In various embodiments, the material removal process for the first layer and removal process for the second layer occur sequentially and essentially continuously.

In various embodiments, an etch stop layer is applied after upper cavity 45 is formed in second layer 38 and before a lower cavity 48 is formed in first layer 35. The etch stop layer may be applied and used in an otherwise conventional manner to promote the formation of the lower cavity. In one example, the etch stop layer is used to create a specific cavity shape with corners similar to those in the structure shown in FIG. 3.

The methods above yield a damascene structure 55 with multiples layers using only a single exposure process. Exemplary damascene structure 55 includes an insulator stack 34 comprising cavity 48 disposed within first layer 35 and cavity 45 disposed within second layer 38. The insulator layer stack 34 is disposed on substrate 32. The resulting damascene structure 55 is similar in some respects to conventional dual-damascene structures. The exemplary damascene structure is suitable for various applications including interconnects for an integrated circuit (IC).

In the resulting product 55 shown in FIG. 4D the top or second layer 38 has a second cavity 45, and the second cavity is formed over a first cavity 48 in the bottom or first layer 35. Cavity 48 has a different size than cavity 45. The exemplary second cavity is wider than the first cavity.

The shapes and dimensions of the cavities formed in the layers may be accurately controlled by a number of process and/or material parameters as will be understood from the description herein. For example, the relative ratio of the width of the cavity in the top layer to the width of the cavity in the lower layer can be varied by judicious selection of materials, the nature of the etching characteristics, the relative thicknesses of the various layers, the width of the resist opening, process time, and other parameters. One will appreciate from the description herein that the cavity width may be modified by selecting and configuring the removal rate characteristics of the layers to be trenched. For example, the cavity width can be increased by selecting a material that is more anisotropic under the given material removal process. One will also appreciate that the cavity width may be adjusted in a similar fashion by adjusting the material removal process conditions. For example, the process etching rate and etching profile may be changed to be more or less anisotropic when removing from one layer versus another layer.

In various embodiments, the precursor structure and/or removal process conditions are selected to create an undercut structure whereby the first cavity is wider than the second cavity. One will appreciate that various number, type, and shape of cavity may be formed in the layers in accordance with aspects of the invention.

In exemplary damascene structure 55, the cavities in the first and second layer are open to each other. In the exemplary embodiment shown in FIG. 4D, the cavities are vertically aligned with one another and form a 'T' shape. The resulting cavities may also be formed in fluid communication with each other, or functionally open to each other. The exemplary second cavity is intended to form a via structure whereas the exemplary first cavity is intended to form a trench or line structure. One will appreciate that a plurality of cavities may thus be formed in the layers to create a three-dimensional pattern of lines and vias for a circuit.

In various embodiments, first layer 35 and second layer 38 are in direct contact with each other without an interlevel dielectric or intermediate etch stop. In various embodiments, first layer 35 and second layer 38 are in direct contact with each other along their entire surfaces. In various embodiments, first layer 35 and second layer 38 are in direct contact with each other in a region adjacent the cavities.

Figure 4E:
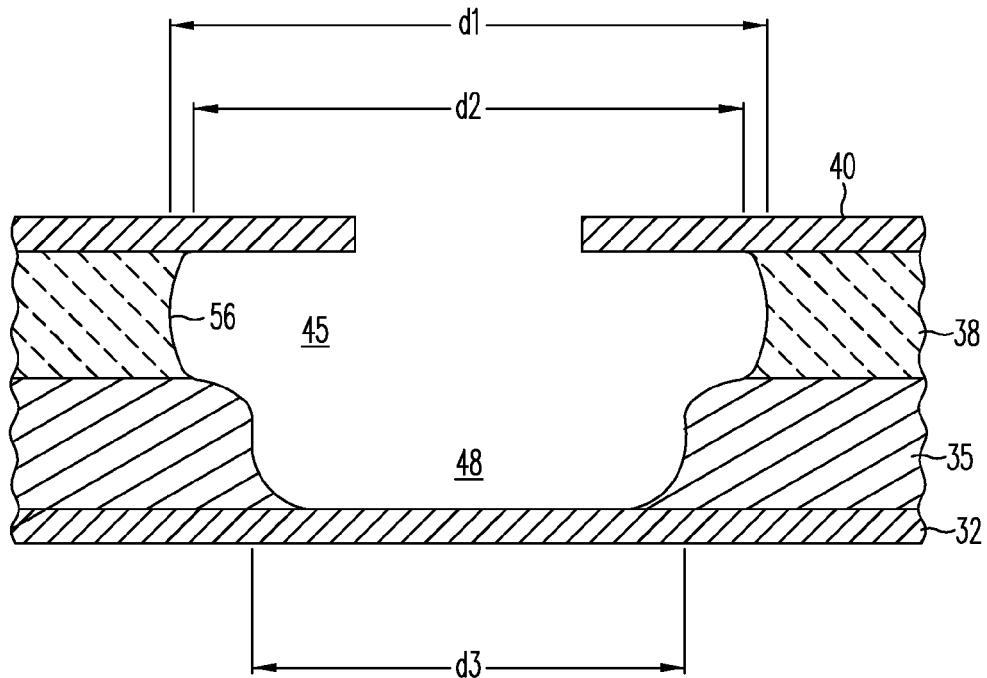

With particular attention to FIGS. 4D and 4E, the resulting cavities defined within each of layers 35 and 38 have novel shapes. The surfaces of the exemplary cavities are rounded and generally free of sharp radiuses or corners. By comparison to the T-shaped cavity of FIG. 3, the cavity formed by the process above has smooth walls 56. The vertical wall sections of both of exemplary cavities 48 and 45 in FIG. 4D are substantially arcuate. In various embodiments, vertical walls 56 are concave. The cavities formed generally have a non-polygonal shape. As shown in FIG. 4E, the cavities have variable widths. In top layer 38, for example, a minimum width d2 is at a top and/or bottom surface of exemplary cavity 45. A maximum width d1 is between the top and bottom surfaces of the exemplary cavity. The minimum width is greater than a maximum width d3 of cavity 48 in bottom layer 35. In an exemplary embodiment, sidewalls 56 are generally parabolic and the maximum width is at about the middle of the vertical sidewalls. In various embodiments, the vertical walls on each side of the cavity are mirror images. In various embodiments, the opposing walls have different shapes. One will appreciate that the precise shape of the walls may be adjusted by the material selection and process parameters. The exemplary sidewalls form a smooth inner cavity surface that is easier to fill than conventional damascene cavities that have sharp edges and corners.

The rounded vertical walls of the exemplary cavities result, in part, from the nature of the fabrication process. Conventional processes use several flat ILDs or etch stops, typically one for each layer to receive a cavity. As shown in FIGS. 2C to 2F, this leads to sharp corners whereby the material is removed vertically below the outermost edges of the etch stop. Material cannot be removed from behind the etch stop. By comparison, the process described above allows for the fabrication of a structure with multiple layers using a single mask and exposure. The shape of the material removed is controlled by the material and process parameters. In the case of etching, the etching chemical attacks the material somewhat uniformly without interference by an etch stop material.

The rounded walls of the multi-damascene structure in accordance with aspects of the invention have several advantages over conventional damascene structures. For one, the rounded walls of the cavities reduce stress concentrations in the material. The reduction and dispersion of stress reduces the failure rate of the product. The rounded walls are also believed to improve subsequent processing such as the filling of the cavities with a conductor.

Figure 5:
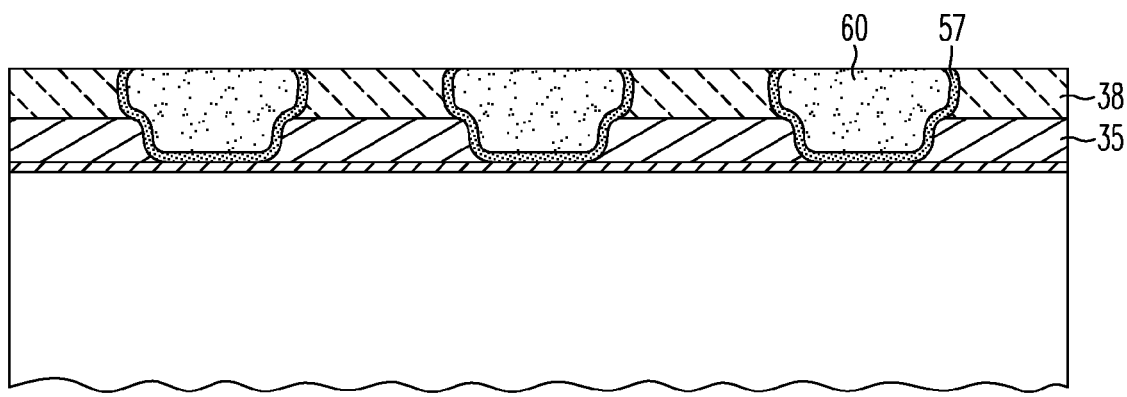
FIG. 5 is a cross-sectional view of a structure, illustrating the structure after removal of the resist layer, metal coating, and metal planarization.

Turning to FIG. 5, after the etching of insulator stack 34, the resist or etch mask 40 over insulator layer 38 may be removed. The substrate may be cleaned to remove unwanted residues from the RIE process.

Next the cleaned structure is lined with a barrier or seed layer 57. Suitable barrier materials include, but are not limited to, NiB, NiW, TaN/NiB alloy, TaN/NiW alloy, TaN, TaN/Ta alloy, TiN, CoP, and combinations of the same.

After applying the barrier layer, the cavity is filled with a gap fill material 60. In an exemplary embodiment, the gap fill material is a metal conductor. Suitable fill materials include, but are not limited to, copper, gold, indium, gallium, tin, nickel, cobalt, molybdenum, tungsten, nickel, aluminum, stainless steel, and alloys. In various embodiments, the gap fill material is a binary, ternary, or quaternary alloy.

In various embodiments, the barrier material and the gap fill material are the same material or similar material. For example, the barrier material may be an alloy film while the gap film material may be an alloy of the same material. The gap fill material may be an alloy, and the barrier material may be an alloy with a higher atomic percentage of one or more components of the alloy material. One material may be pure and the other may be an alloy of the same material. As will be described below, the gap fill material may also be an insulator in the case of filling gaps in a patterned metal layer. The processing of the barrier layer may be tailored to deposit a continuous and fully conformal layer within the cavities 48 and 45. The gap fill process may be tailored for a bottom-up or upper-filling deposition profile within the damascene cavities.

After depositing the gap fill material, the structure may be thermally treated to stabilize the microstructure of the gap fill material prior to subsequent processing. The stabilizing may include annealing or other known techniques. Next the metal coated substrate is optionally planarized to obtain a metal filled dual damascene structure as depicted in FIG. 5.

The damascene structure 55 may be a final product or intermediate product. In various embodiments, additional structures are built upon the damascene structure. In various embodiments, additional layers are added to the structure. For example, the process described above may be repeated to build more layers on top of layer 38. One will appreciate that damascene structure 55 may be used or modified in various ways similar to conventional damascene structures.

In various embodiments, one or more additional layers are applied over second layer 38 prior to any or all of the material removal processes. The material removal process then proceeds as described above to form a damascene structure with three or more layers in stack 34. Alternatively, the additional layers may be added using a conventional protocol of repeated patterning, exposure, masking, and etching for each layer.

In various embodiments, metal structures are built upon a top of damascene structure 55. In various embodiments, a continuous layer of conductor material is formed over the top of the structure. The conductor layer may be planarized to form a flat surface. A protective layer may be applied over the conductor layer. Thereafter, additional layers and/or structures may be built up. Further details regarding a metal subtraction process and gap filling with insulator will be described below with respect to FIGS. 9 and 10.

Figure 6:
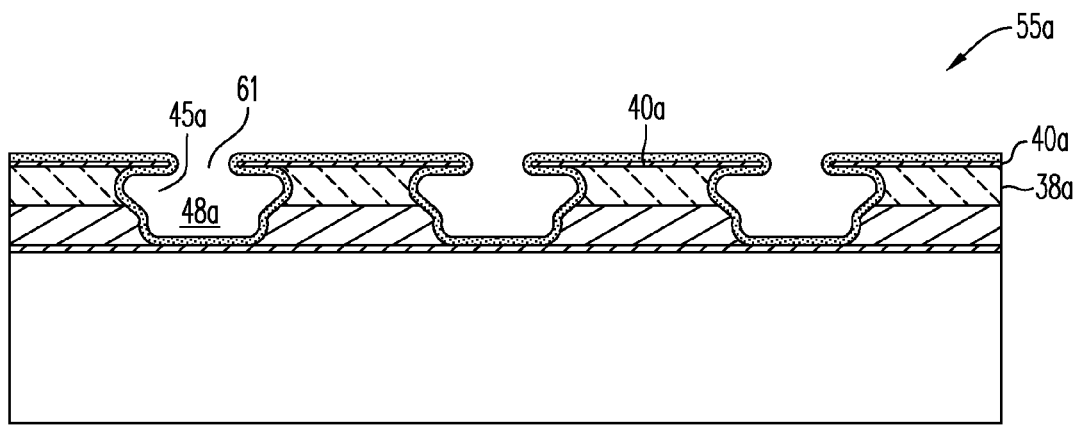
FIG. 6 is a cross-sectional view of a structure similar to that of FIG. 4D, illustrating coating of the structure with a barrier, seed layer, or both.
Figure 7:
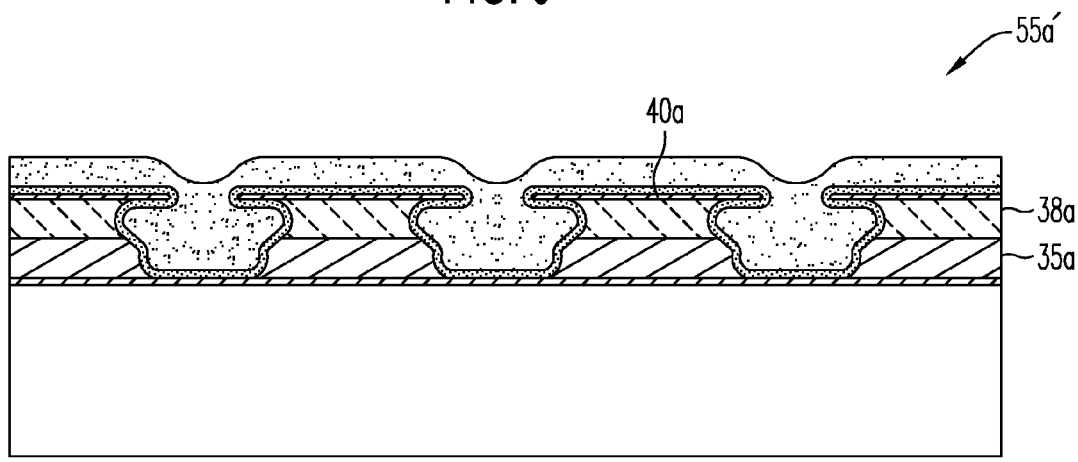
FIG. 7 is a cross-sectional view of the structure of FIG. 6, illustrating filling of the cavities with a conductive gap fill material.

FIGS. 6 and 7 illustrate a variation of the method above. The method relates to fabricating a semiconductor device from a multi-damascene structure without removing the resist layer/mask. Instead of removing resist layer 40*a* as shown in FIG. 5, resist 40*a* is left in place when the seed or barrier layer is applied. The structure 55*a* is coated with the barrier layer such that the barrier material covers an interior of cavities 48*a* and 45*a*. In an exemplary embodiment shown in FIG. 6, the barrier layer coats an underside of the resist material that overhangs the cavities. This area is referred to as the "shadow" because it is not visible through opening 61 in the resist layer. In an exemplary embodiment, the resist layer overhangs the cavities formed by the material removal process. The barrier material coats the underside of the cantilevered portion of the resist layer. In an exemplary embodiment, the barrier layer coats all of the interior surfaces. In various embodiments, the barrier layer coats all of the exposed surfaces of the cavity and resist layer.

The barrier material can be applied to the interior of the cavities using sputtering, atomic layer deposition, electroless deposition, and the like. In some applications, it may be preferable that the bather layer is applied with a wet process to coat the under-region of the substrate. The barrier layer may include, but is not limited to, NiB, NiW, TaN/NiB, TaN/NiW bilayer, TaN, TaN/Ta, TiN, CoP, and or other barrier materials. The barrier layer may be applied by known methods. In various embodiments, the barrier/seed process deposits the barrier or seed material continuously and uniformly within the cavity of interest.

In various embodiments, the barrier-covered damascene structure is subsequently filled using a copper gap filling bath to produce a void-free metal structure as shown in FIG. 7. The plated film may be stabilized by annealing the substrate by known methods. The annealed substrate is polished to remove unwanted materials. The process may be repeated to build more layers on the structure. In various embodiments, etch mask 40a is further configured as a planarization stop. Thus, the top surface may be planarized and polished using the etch mask. Thereafter additional layers of conductors and/or insulators may be stacked over the resulting structure.

Referring to FIG. 7, after the barrier layer has been applied to the cavity interior, the cavity is filled with a conductor material similar to the process described above. Unlike the structure of FIG. 5, however, the structure of FIG. 7 includes etch mask 40a material within the deposited conductor material. The resulting structure 55a' thus includes a stack of insulator layers and an intermediate member, namely resist or etch mask 40a, between the uppermost layers 35a and 38a. The intermediate etch mask further includes a coating of seed or barrier material.

Figure 8A:
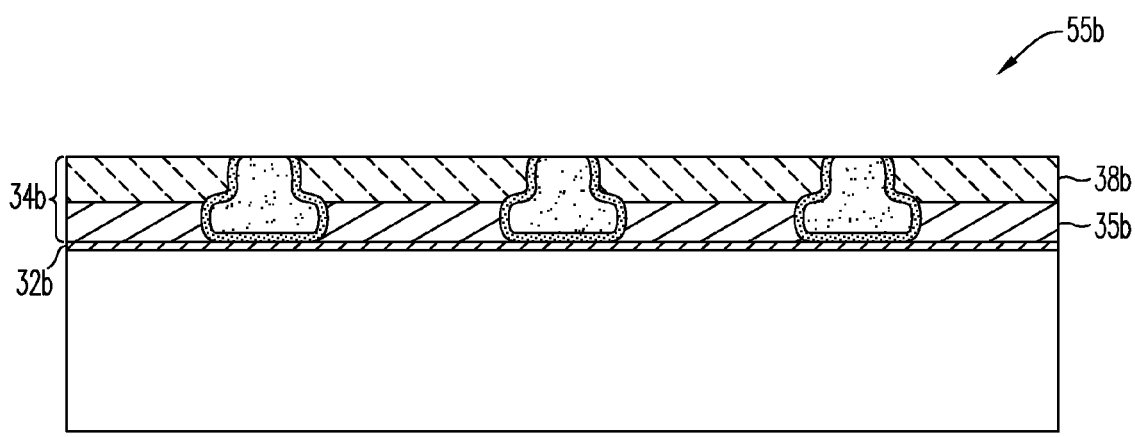
FIG. 8A is a cross-sectional view of an exemplary inverted dual damascene structure in accordance with aspects of the invention.

Turning to FIG. 8A, another multi-layer damascene structure in accordance with aspects of the invention is shown. Damascene structure 55b is similar to damascene structure 55 except that the cavity structure is inverted. The bottom layer 35b has a wider cavity than the top layer 38b. The illustrated structure 55b may be created similar to damascene structures 55 and 55a above.

In various embodiments, damascene structure 55b is formed from a precursor structure having a first layer 35b and second layer 38b overlying a substrate 32b. The exemplary first layer has a higher etching rate than the second layer. In various embodiments, the etching rate and etching profile in the first layer is more anisotropic than the second layer.

In various embodiments, the first and second layers are separated by an inter-level dielectric layer. After patterning with a suitable resist, the removal condition is chosen to create an undercut structure in first layer 35b beneath second layer 38b. Alternatively, or in addition to the above material configuration, the undercut structure may be created by selective control of the material removal process similar to the process described above with respect to FIG. 4D. In various embodiments, after etching through top layer 35b the process is adjusted to be more anisotropic when removing material from second layer 38b. Thus, the process can be selected to accomplish the same effect as the material characteristics above.

In the exemplary resulting structure, referred to generally as an Inverted Dual Damascene (IDD), a via structure is disposed over a line structure. The cavity structure on the bottom is larger than the one on top. The exemplary damascene cavity—the combined top cavity and bottom cavity—is lined with a suitable barrier/seed layer prior to filling with a conducting material, for example, copper. The stabilized substrate is polished to remove unwanted materials and form a final product as shown in FIG. 8A. The process may be repeated to add additional layers, or the structure may be combined with the structure of FIG. 5 to create a different structure. The structure may also be combined with conventional damascene structures to form different structures. Thus, typical methods and structures of the invention have a high level of manufacturing flexibility.

Figure 8B:
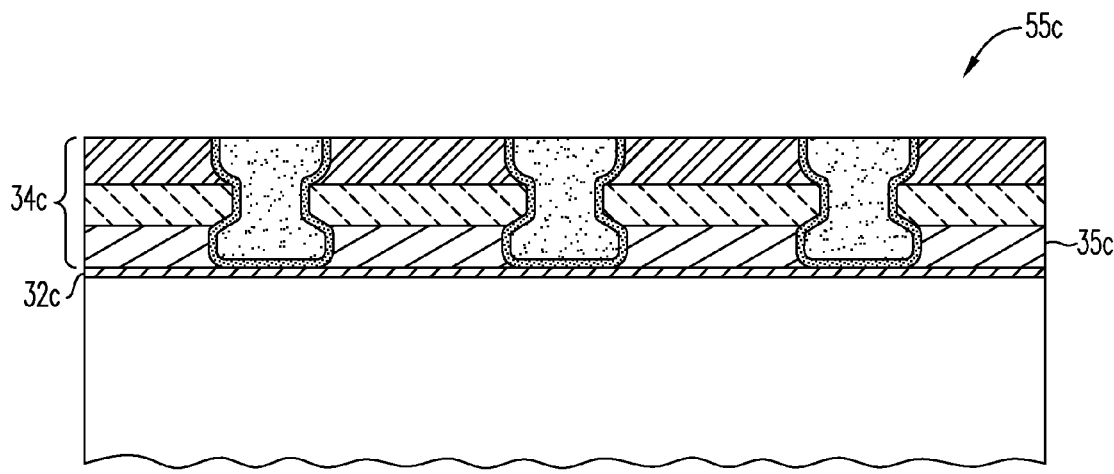
FIG. 8B is a cross-sectional view of the structure of FIG. 8A, illustrating addition of a third insulating layer having via structures over the second insulating layer to form a dumbbell structure in accordance with certain embodiments of the invention.

The damascene structure in accordance with aspects of the invention may be used to fabricate a variety of multi-layer structures. FIG. 8B illustrates an exemplary structure 55c formed using structure 55b of FIG. 8A. The exemplary multiple insulator stack 34b (FIG. 8A) is used to fabricate a novel multi-layer structure. In the exemplary embodiment, three insulator layers are stacked over each other and patterned similar to the methods described above. The insulator layers may be stacked directly over one another or separated by one or more layers, such as an inter-level dielectric layer.

The resulting insulator stack 34c may be symmetric or asymmetric. The exemplary stack 34c of FIG. 8B is an asymmetric stack in the shape of a dumbbell structure. In an exemplary embodiment, the structure is symmetric. One will appreciate that the structure may be asymmetric. The techniques described can be used to form structures with various shapes and sizes. In an exemplary embodiment, the insulator stack defines a line structure sandwiched between two via structures. The stack is created with a single lithography step using the techniques described herein. By contrast, the illustrated dumbbell structure would be difficult, if not impossible, to fabricate using conventional damascene processes. Conventional processes would be expensive and require forming the layers in distinct steps with individual lithography steps. The structure created by conventional techniques would also likely have sharp corners and significant internal stresses.

One will appreciate from the description herein that the damascene structures described thus far may also be formed by applying the metal and insulator materials in the reverse order. In general, the damascene structure may be formed by stacking metal layers over the substrate, etching a pattern in the metal, and then filling gaps in the metal with insulator material.

Figure 9A:
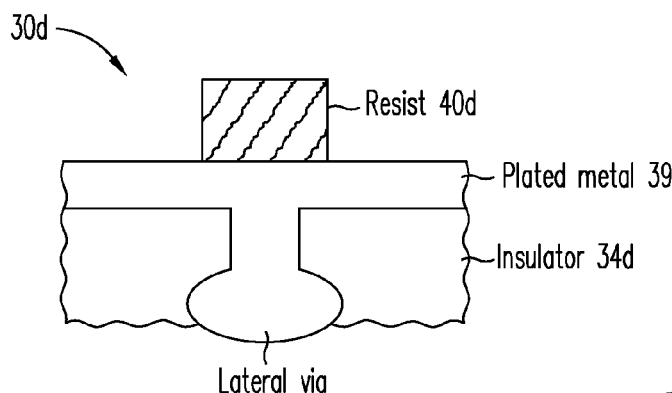
FIGS. 9A to 9H are sequential cross-sectional views of other damascene structures similar to FIG. 4D produced in accordance with aspects of the invention, illustrating patterning of a metal layer and filling with an insulative material.
Figure 9B:
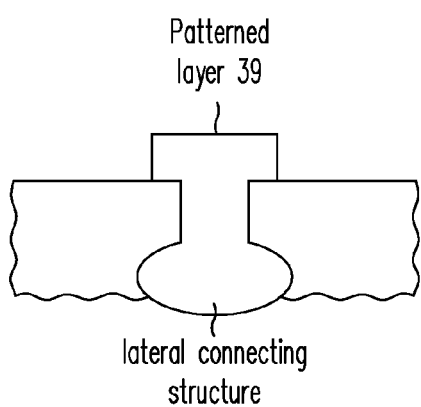
Figure 9C:
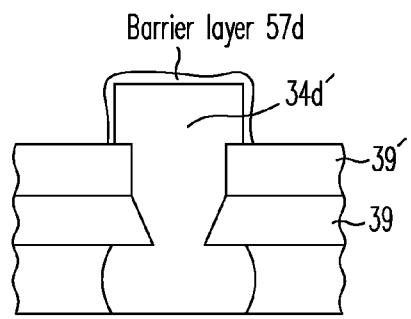
Figure 10:
FIG. 10 is a cross-sectional view of a precursor structure similar to that of FIG. 4A, illustrating two metal layers over a substrate and an imaged resist mask.
Figure 10:
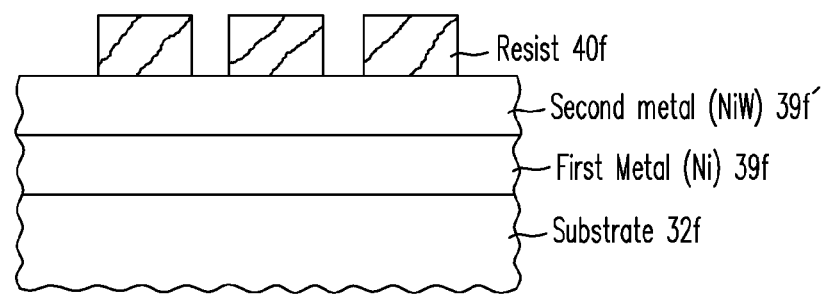

Turning to FIGS. 9A to 9C, several techniques are shown for fabricating novel structures using the damascene structures and methods described above. FIGS. 9A, 9B, and 9C illustrate an exemplary method for etching metal and filling with insulator.

With reference to FIG. 9A, a dual damascene structure is fabricated using the techniques described above. After filling the created cavities with a conducting metal, for example copper, the conductor is stabilized by thermal treatment. Unlike the structure shown in FIG. 8A, for example, a layer of metal 39 is formed on the top surface over the insulator layers 34d. The coated substrate may be partially planarized to obtain a globally flat topography, continuous-conducting metal layer (shown in FIG. 9A). The partial planarization step is optional and may be omitted. The resulting structure shown in FIG. 9A is similar to the structure shown in FIG. 7 except the plated metal is planarized to a flat surface. In various embodiments, the planarized metal layer has a thickness greater than 100 nm, greater than 200 nm, greater than 300 nm, greater than 350 nm, or greater than 500 nm. In an exemplary embodiment, the thickness is greater than 350 nm.

Next the structure is patterned with a suitable resists 40d over the metal as shown in FIG. 9A. Unwanted materials are removed, for example, by wet etching, electro-etching, electro-polishing, and other known techniques. After patterning with a suitable resist, a portion of metal 39 is removed using the resist to form a patterned layer as shown in FIG. 9B. The resulting patterned layer includes one or more sections of metal in electrical communication with the conductor materials beneath in the dielectric cavity. In another embodiment illustrated in FIG. 9C, a multi-level wiring structure includes a metal filled cavity 34d. The metal feature is continuous between the various levels, and the various levels are not separated with one or more barrier layers or barrier material. For example, the patterned metal structure 39 may be created or disposed over the metal structures of FIG. 8B to produce the continuous conduction wiring structure of FIG. 9C without barrier material isolating or separating the various metal levels.

The exemplary fabricated structure may be coated with a protective layer and/or barrier material 57d (shown in FIG. 9C) to eliminate environmental contamination or degradation of the structure from subsequent processes. In many applications, for example, it is desirable to include a barrier for protection of the metal against oxidation. In various embodiments, damascene structure 55d may include one or more additional layers 39' over the top of the patterned layer. In various respects the structure shown in FIG. 9C is similar to the structure shown in FIG. 8B. The figures illustrate the variety of structures that may be produced in accordance with aspects of the invention.

The resulting structure shown in FIG. 9C is a continuous structure without barriers and ILDs between the wiring layers. An advantage of this continuous metal wiring structure is lower device resistivity and an accompanying increase in the device performance and reliability.

The damascene structure may be fabricated using methods similar to those described above for insulator subtraction. In various embodiments, two metal layers are applied over the substrate and each have different removal rates for a given removal process. Suitable materials for the precursor structure are similar to those described herein. In various embodiments, two metal layers are applied over the substrate and the material removal process is configured to removal material from each metal layer with a different removal profile. The removal profile for one layer may be more or less isotropic than the other layer. The removal rate, time, and/or other characteristics may be adjusted and selected to fabricate the desired resulting structure having different cavities. In various embodiments, the stacked layers having cavities of different sizes are formed from a single material by selective adjustment of the removal process. For example, the top of the material may be subjected to one material removal process profile whereas the bottom is subjected to a different material removal process profile to create a different sized cavity. In various embodiments, the precursor structure includes three or more metal layers and the cavities are formed in the three or more layers using the single resist. In various embodiments, one or more additional layers are added using conventional techniques such as repeated alternation of photolithography and etching for each layer.

Figure 9D:
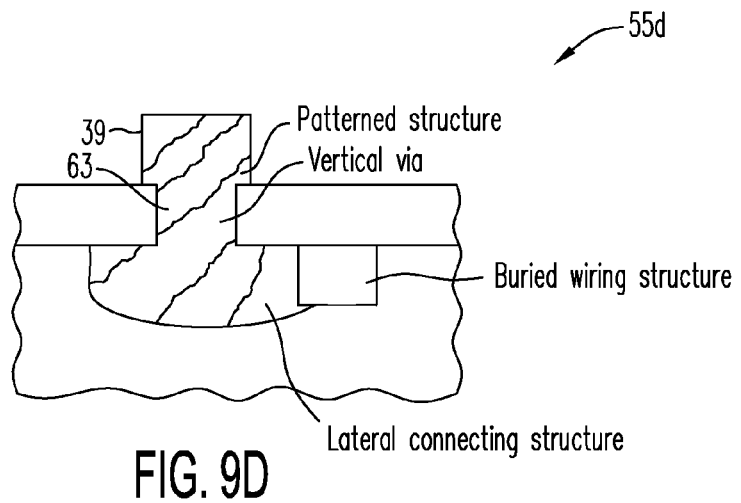

In various embodiments, patterned layer 39 of FIG. 9D is significantly higher or thicker than the conducting layer(s) 63 beneath it. For example, the height of the patterned conductor 39 may be about 2 to about 100 times the thickness of the conducting line or via layer 63 beneath it. For practical purposes, the structure may be considered a pillar with the distinct feature of not containing any barrier layer between the pillar 39 and the via 63, and/or the trench cavity beneath it. In various embodiments, the patterned metal layer has a thickness greater than 300 nm. In various embodiments, metal layers 39 are in direct contact without an intermediate etch stop layer. The exemplary structure 55d has two patterned layers each with cavities of different widths. The cavity on the bottom may be wider than the cavities above it, or vice versa.

As will be understood by the description herein, some methods and structures of the invention can also be used with existing structures to make novel electrical connections. In FIG. 9D, for example, a lateral via or lateral connecting structure is used to make electrical connections to other buried wiring structures. Methods of the invention thus typically provide for substantial manufacturing flexibility, and at reduced cost and complexity.

Figure 9E:
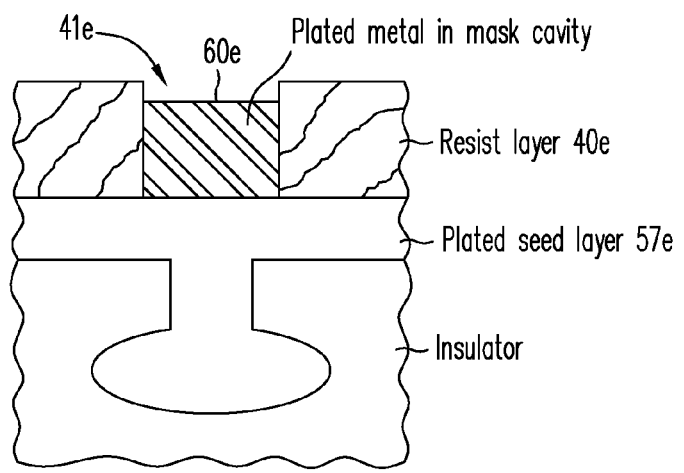
Figure 9F:
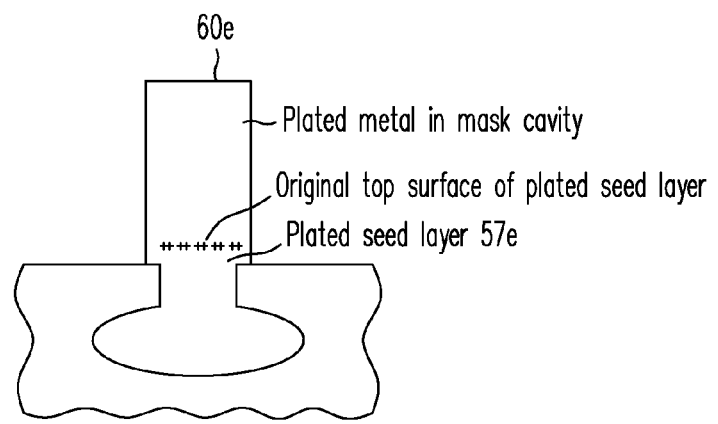

FIGS. 9E and 9F illustrate variations of the method described above with respect to FIGS. 9A to 9D. In various embodiments, the unplanarized or partially planarized structure is patterned with a suitable resist 40e for through-mask plating applications. Here, a suitable metal 60e is coated within a cavity 41e of the of mask material 40e (shown in FIG. 9E). The resist material 40e is then removed (shown in FIG. 9F). Next, the original thick-plated seed layer 57e is removed by known methods.

In some embodiments, metal 60e plated in the mask cavity 41e is different from the plated seed layer material. For example, the plated seed layer may be an alloy layer while the through-mask coated layer may be copper, nickel, aluminum, gold, noble or non-noble metals and their respective alloys, and the like. In various embodiments, the metal and seed layer materials are the same. Thus, depending on the nature of the plated seed layer and the through-mask coated layer, the original surface of the plated seed layer may be distinct when the metals are dissimilar and emergent when the metals are sufficiently similar.

The resulting structure shown in FIG. 9F is similar to the structure shown in FIG. 9D. The structure shown in FIG. 9F illustrates a micro-pillar formed by removing part of the seed layer and all of the resist. The result is a structure with novel proportions. The method results in a micro-pillar that is taller than conventional micro-pillars. The resulting structure in FIG. 9F also includes a keyhole structure, which is similar to engraving the pillar structure. In various embodiments, there is no barrier layer separating the pillar structure from other conducting feature beneath it.

Figure 9G:
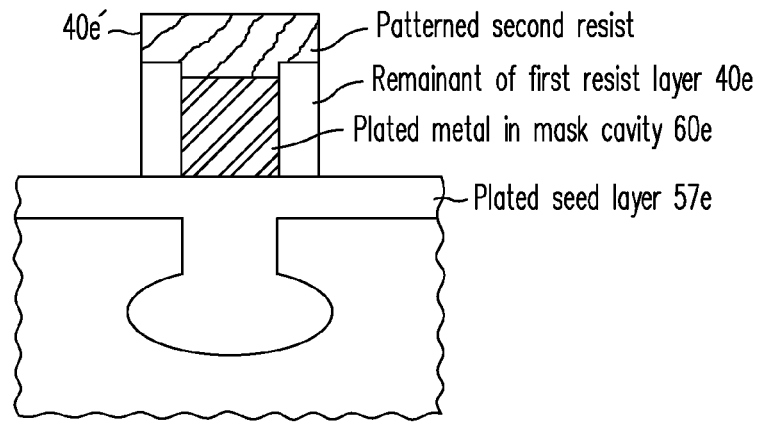
Figure 9H:
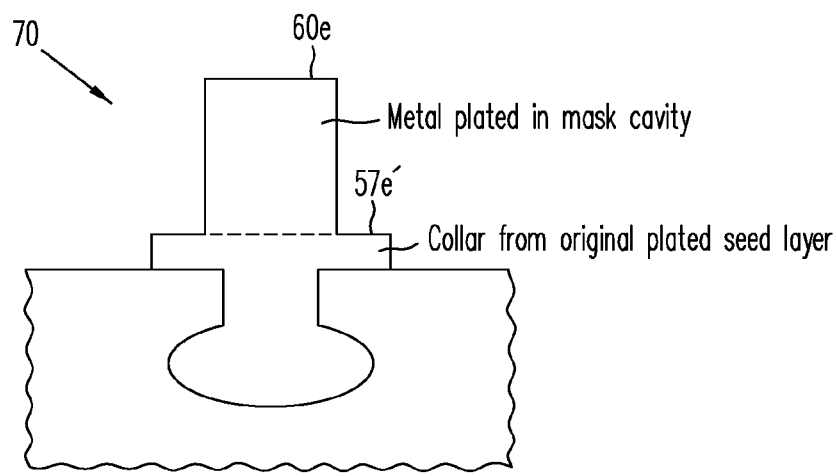

Referring to FIG. 9G, a second resist 40e' may be patterned over first resist layer 40e. The undesirable portions of resist materials may be removed to expose the thick-plated seed layer 57e beneath (shown in FIG. 9H). The plated seed layer may be removed to produce comparatively well-defined structures with sharp profiles as shown in FIGS. 9G and 9I1.

The structure shown in FIG. 9I1 is obtained by patterning with resist 40e', removing material, and then removing the resist. Portions of original plated seed layer 57e may be left open as a collar surrounding the resulting through-mask plated structure 70. The resulting collar is unlike anything found in conventional structures. The collar provides additional stability for the micro-pillar formed by metal 60e. Depending on design, the patterning may be designed to eliminate any collar features in the structures.

Although the methods have been described thus far with respect to the use of RIE methods for material removal and subtraction, one will appreciate that a variety of material removal techniques may be used. Suitable material removal processes include, but are not limited to, wet and dry removal processes. In an exemplary embodiment, the narrower cavity in the structure is created by a relatively more anisotropic wet removal process and the wider cavity is created by a relatively less anisotropic wet removal process. One will appreciate that the methods described herein may also be used for material addition processes.

Most of the various methods described thus far have focused on the creation of cavities in insulative layers. Similar cavities can be created in a conduction layer or layers on a substrate. A substrate may be coated with one or more layer of conducting films wherein each layer exhibits different etch rates and/or etch rate anisotropy for a given etching condition. For instance, the first conducting layer on the substrate, with or without the barrier layer, may be a pure or a relatively pure element. The second metal coated over the first metal may be an alloy of the first metal.

Suitable materials for the first metal include, but are not limited to, Cu, Ni, W, Al, noble metals, and other material of interest. For example, suitable materials for the second metal include, but are not limited to, Cu alloy over copper, CuW coated over Cu, NiW coated over Ni, one Al alloy over another Al alloy, solder over barrier layer over copper, and other materials and alloys of interest. One pure metal may be coated over one another, for example W over Cu or vice versa. In various embodiments, the layers include the same metal component. In an exemplary embodiment, the first layer is AlCu and the second layer is AlSi. In various embodiments, the first layer and second layer are essentially the same material but differ, for example, in grain size, state of stress, or other properties that impose different etching rates. In various embodiments, a first alloy layer is coated over with a second alloy layer. In various embodiments, more than two layers are used to form the multi-damascene structure using a single exposure process. Each of the layers may be capped with a barrier layer as described above and as shown, for example, in FIG. 10. The barrier layer may be configured to improve metal-to-metal bonding.

FIGS. 10-20 illustrate several other variations to methods and structures described above. In an exemplary embodiment, the narrower cavity in the patterned substrate is created by coating a first layer 39$f$ of Ni on a substrate of interest and a second layer 39$f'$ of Ni alloy such as NiW. In various embodiments, the second layer has a nano-particle grain size and the first layer has a relatively larger grain size (shown, e.g., in FIG. 10).

Figure 11:
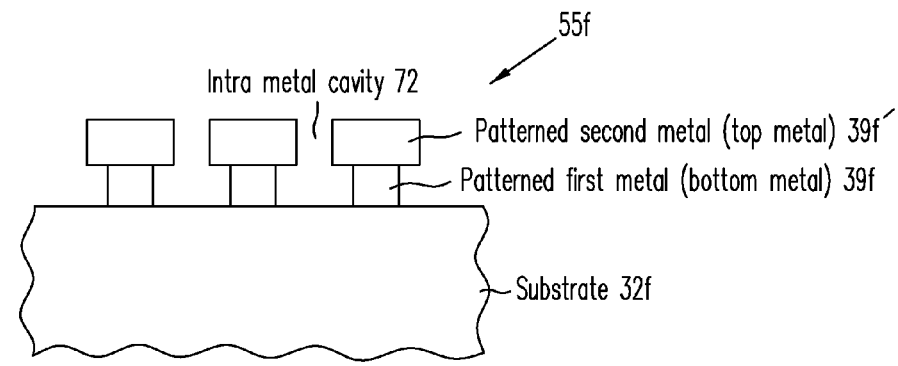
FIG. 11 is a cross-sectional view of the precursor structure similar of FIG. 10 after removing material from both layers using the resist mask, illustrating a wider cavity in a lower layer than a cavity in a top layer.
Figure 12:
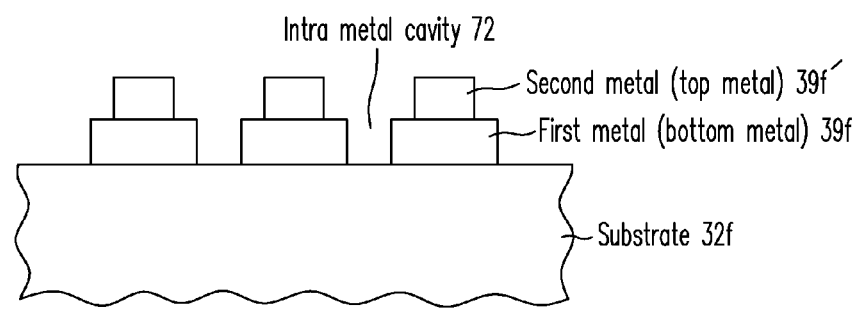
FIG. 12 is a cross-sectional view of the precursor structure similar of FIG. 10 after removing material from both layers using the resist mask, illustrating a wider cavity in a top layer than a cavity in a bottom layer.

The coated substrate is patterned and etched by one or more removal steps, and the larger structures are created on top and narrow structures created beneath (shown, e.g., FIG. 11). The resulting exemplary structure is a dual patterned metal etch structure having a larger cavity positioned below a smaller cavity. The inverted structure may be fabricated using similar methods to those described above and inverting the metal stack in the laminates. For example, as shown in FIG. 12, Ni is over NiW. In various embodiments, the resulting structure is fabricated by selective use of materials in the precursor structure to control the material removal condition. For example, the etch rate of Ni is higher than that of NiW ($Ni_r$>$NiW_r$) when Ni is the top layer. The thickness of the various layers may vary depending on application requirements. The bottom layer may be substantially thicker or taller than the layer or layer above and vice versa. Although the illustrated structures have generally straight sides and sharp corners, one will appreciate from the description herein that the shapes formed may be curvilinear and rounded.

In an exemplary embodiment, the patterned metal 39$f$ is cleaned to remove the unwanted materials, including the resist film material. The sides of the exposed metal surfaces may be selectively coated with a thin barrier layer or protective layer 57$f$. The barrier layer may be applied by electroless methods or other methods. The barrier layer is optional.

As shown in FIG. 12, the removal process results in a plurality of intra-metal cavities 72, defined as the cavities between adjacent conducting features. The intra-metal cavities may be filled with one or more insulative materials 35$f$. The resulting structure shown in FIG. 12 is generally similar to an inverted version of the structure in FIG. 11.

Figure 13:
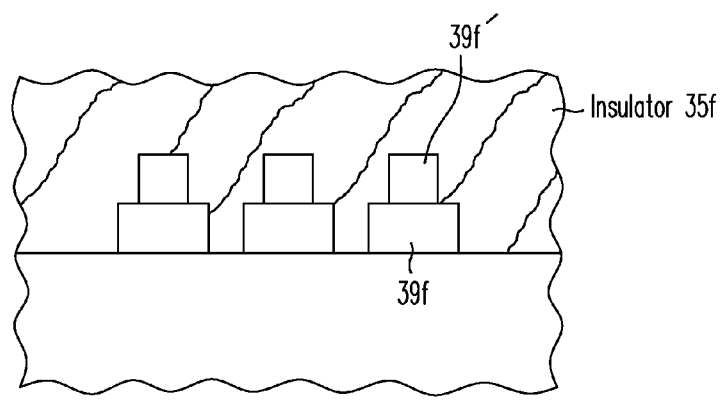
FIG. 13 is a cross-sectional view of the structure of FIG. 12 after coating with an insulator material.
Figure 14:
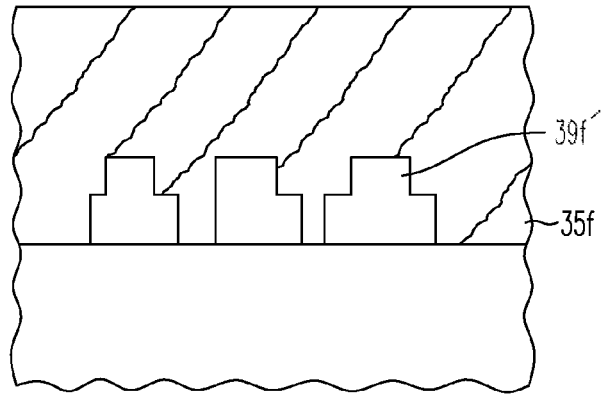
FIG. 14 is a cross-sectional view of a structure similar to that of FIG. 12 coated with an insulator material, illustrating different sizes and shapes of cavities formed with a single exposure in accordance with aspects of the invention.
Figure 15:
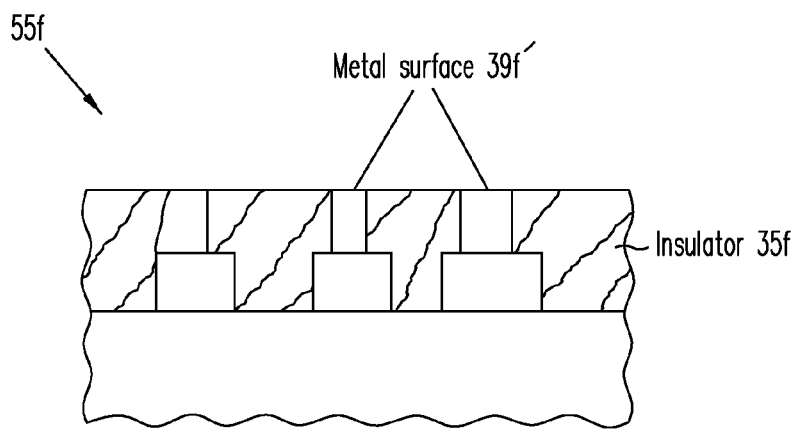
FIG. 15 is a cross-sectional view of the structure of FIG. 13 after a planarization process, illustrating exposure of a top surface of the metal structures.

FIG. 13 illustrates the resulting structure of FIG. 12 with insulator-filled cavities. The insulator-filled metal layer is planarized. The planarization may be chemical-mechanical planarization or other known methods. The planarization method removes the undesirable insulator regions as shown in FIGS. 14 and 15. In the resulting structure of FIG. 15, the metal surfaces are exposed. Additional processing may be subsequently performed as would be understood by one of skill from the description herein.

The structures shown in FIGS. 13-15 and methods described above may be especially useful for certain applications. For example, the above technique for building metal structures and then filling with an insulator may be useful for aluminum and platinum structures. The resulting structure also has other advantages. In various embodiments, insulator 35$f$ coating the metal structures has a low k, which leads to improved device performance. In various embodiments, the k value is less than 3.5. In various embodiments, the k value is between about 1.5 and about 3.5. The low k value is made possible by the techniques described above. With conventional dual damascene processes, the addition process generally increases the k value as the material becomes more hydrophilic as a result of RIE radiation damage. With the above process, the insulator does not generally change because it is only subjected to mechanical processes. Also, the insulator is not subjected to RIE plasma damage because the lithography exposure applies to metal features and not to the low k insulative layer.

Figure 16:
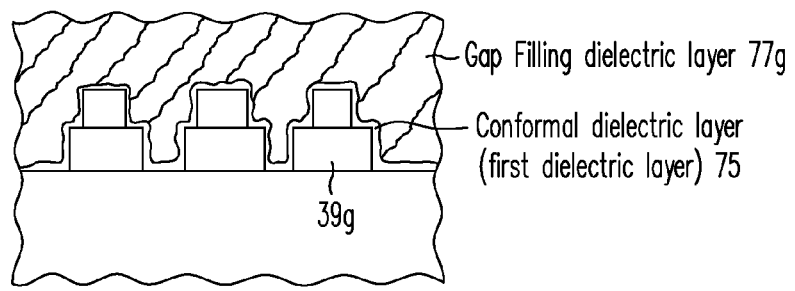
FIG. 16 is a cross-sectional view of the structure of FIG. 13, illustrating a conformal dielectric layer surrounding the metal structures.
Figure 17:
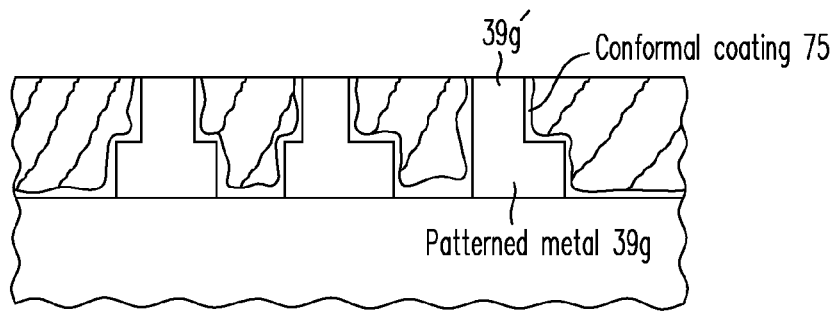
FIG. 17 is an enlarged cross-sectional view of a structure similar to that of FIG. 16, illustrating different conformal dielectric material surrounding the metal structures.

FIGS. 16 and 17 illustrate a variation making use of the insulative barrier characteristics. In some applications, the insulative layer 77$g$ may exhibit good barrier and good adhesive properties with respect to the surface of the etched patterned metal layer 39$g$. For example, the cleaned substrate may be exposed to silane gas and silane plasma prior to coating of a thin conformal dielectric layer 75. For example, a layer of silicon nitride, silicon carbide, or borosilicate glass may be provided over the exposed metal surface, and the remaining cavity may be filled with another dielectric material 77$g$. The conformal dielectric layer and the gap filling dielectric material may be the same material. The conformal dielectric layer and the gap filling dielectric material may be coated under different or similar conditions depending on the application. In various embodiments, the gap fill dielectric 77$g$ is a low k material.

The coated substrate may be polished, as described above, to expose the metal surfaces 39$g'$ and other surface of interest. In the exemplary embodiment of FIG. 17, conformal protective layer 75 encapsulates the metal features except at their top surfaces 39$g'$. In various embodiments, the metal surfaces are partially encapsulated. In various embodiments, the metal surfaces are completely encapsulated.

Figure 18:
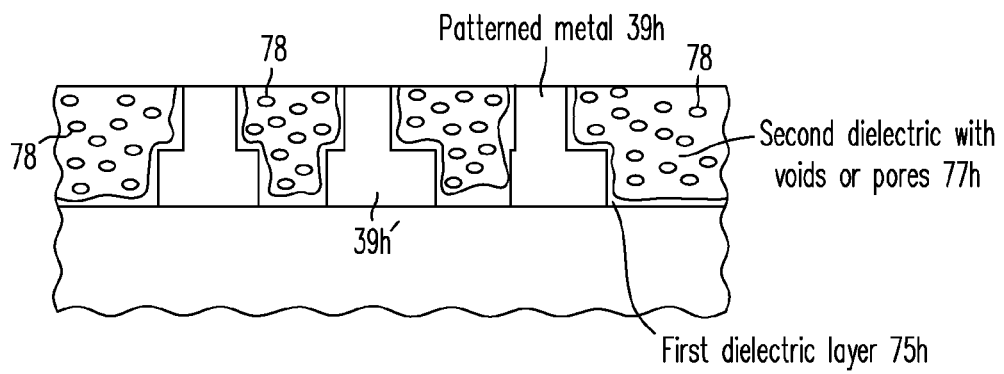
FIG. 18 is an enlarged cross-sectional view of a structure similar to that of FIG. 16, illustrating a conformal dielectric material having trapped voids.

Referring to FIG. 18, the insulator layer may include voids or additives. In various embodiments, it is desirable to adjust the voids in the intra metal cavities. For higher performance applications, for example, the dielectric material 77$h$ is deposited into the intra-metal cavities 72$h$ in such a manner that additives or voids 78 are trapped or incorporated between adjacent conducting features 39$h$ and 39$h'$. The effective dielectric constant of the resulting insulative layer is reduced. The structure may be finished with a polishing process. In general, the structure does not need plasma processing.

In various embodiments, more than one type of insulative material is used. For example, a very thin conformal layer 75$h$ of boron-doped glass, silicon nitride, silicon carbide, or the like may be coated over metal features 39h as the first dielectric layer in contact with the metal features. An exemplary low dielectric constant (k) layer is then coated over the metal as the second dielectric layer. In various embodiments, the second layer includes nano-sized air bubbles 78. In various embodiments, a third dielectric is coated over the metal in such a manner to plug the top opening of intra-metal cavities 72h. Thus, larger voids are formed in the resulting wiring structure.

Figure 19:
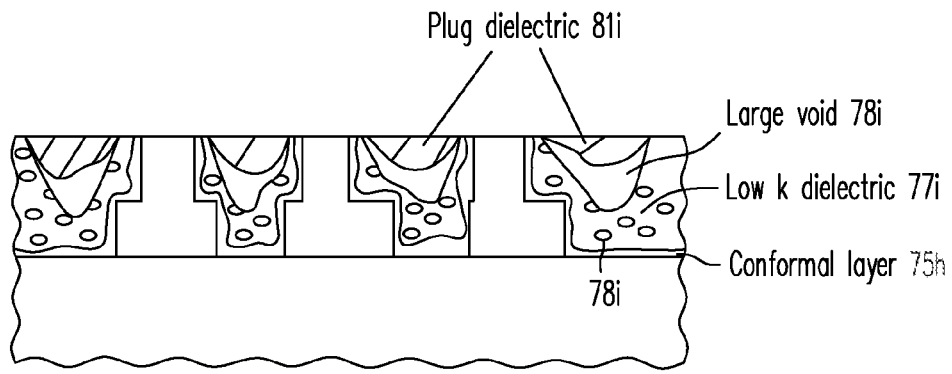
FIG. 19 is an enlarged cross-sectional view of a structure similar to that of FIG. 16, illustrating a conformal dielectric material having trapped voids of different shapes and sizes.

After the insulator gap fill of the metal cavities, unwanted insulator may be removed by planarization or other known methods. FIG. 19 shows an exemplary structure with trapped voids 78i after planarization. A third dielectric is coated over metal 39i to form plugs 81i the top opening of the intra-metal cavities. In various embodiments, only a portion of the insulator material 77i includes trapped voids. The trapped voids may be of essentially the same size or of different sizes.

Figure 20:
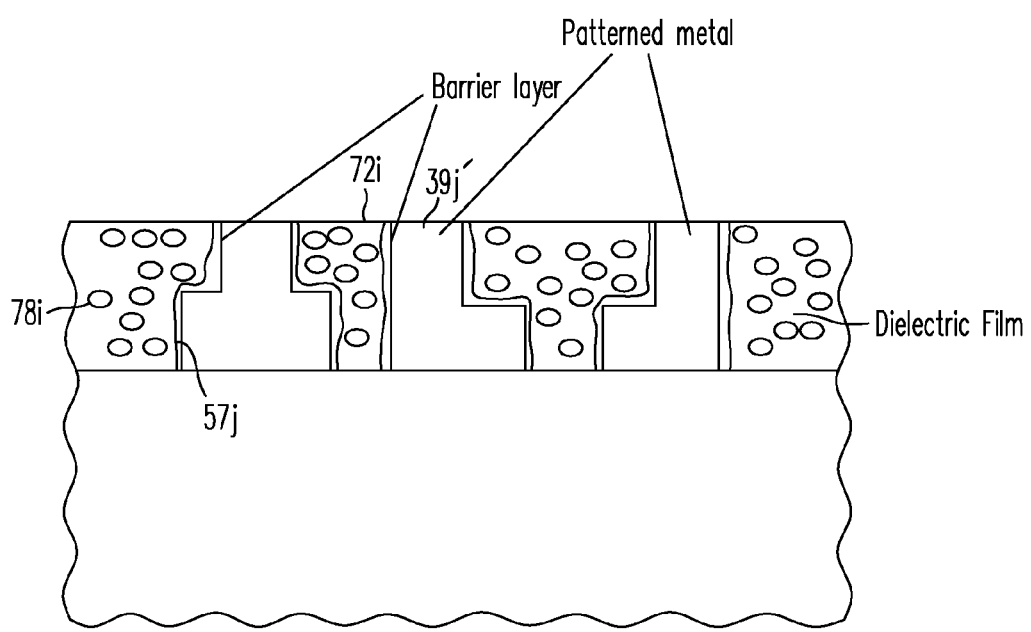
FIG. 20 is an enlarged cross-sectional view of a structure similar to that of FIG. 15, illustrating a barrier layer surrounding the metal structures.

Turning to FIG. 20, in some applications it may be desirable to selectively coat the surface 39j' of the cleaned etched metal surface with a thin barrier layer 57j. The barrier may be applied by electroless methods or other methods. Suitable barrier materials include, but are not limited to, a thin layer of nickel and cobalt alloy or their combinations, for example, CoP, NiP, CoWP, or a laminate of CoWP/NiP. In various embodiments, the thickness of the alloy selective barrier coating is between about 2 nm and about 2000 nm. In some embodiments, the thickness is between about 10 nm and about 100 nm. The adjoining gaps and the intra-metal cavity 72i between the barrier surfaces are then filled with a suitable dielectric material 35j. In various embodiments, the insulator material is a dielectric with a low-k film. The insulator may include relatively large air gaps 78j as described above. Multiple layers and/or types of dielectric coatings may be used depending on the application. After the insulator gap fill, unwanted insulator may be removed by planarization or other known methods. The exemplary structure of FIG. 20 is a through-silicon-via (TSV). New metal layers may be coated on the planarized surface, the metal may be patterned, and the intra metal cavities may be filled with an insulative layer as described herein to fabricate multilayer wiring structures.

Various methods in accordance with aspects of the invention may be combined with conventional single and dual damascene processes to fabricate various devices and non-device wiring structures as would be understood by one of skill from the description herein. The structures are suitable for various semiconductor products including, but not limited, to an interposer, a TSV structure to chip interconnect, device packaging, and other devices.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed:

1. A method of fabricating a damascene structure with a single exposure, comprising:

forming a pre-metal first layer of dielectric material on a surface of a substrate, the substrate comprising a region of semiconductor material, the first layer having a thickness in a direction projecting above the surface;

forming a pre-metal second layer of dielectric material on the first layer;

patterning a lithographic mask over the second layer;

removing material from the second layer to form one or more second cavities using the lithographic mask;

removing material from the first layer using the lithographic mask to form one or more first cavities which are open to the one or more second cavities, the first cavities extending through the thickness of the first layer so as to expose portions of the surface of the substrate, wherein the removing of the material from the first layer is performed at a different rate than the removing of the material from the second layer, and wherein the removing of the material from the first layer is performed such that the one or more first cavities have a width different from a width of the one or more second cavities open thereto, the widths being in a first direction;

forming a coating including at least one of a seed layer or a barrier layer, the coating contacting walls of one of more of the second cavities and walls of one or more of the first cavities which are open to the one or more first cavities, the coating contacting one or more of the portions of the surface exposed within the one or more first cavities; and forming a conductor in the one or more of the first cavities and in the one or more of the second cavities open thereto, wherein a width of the conductor in the one or more first cavities in the first direction is different from a width of the conductor in the one or more second cavities in the first direction;

wherein the removing of the first and second layers comprises wet etching, wherein the removing of material of the second layer is more isotropic than the removing of material of the first layer.

2. The method of claim 1, the removing of the first and second layers comprising wet etching, wherein the first and second layers having different removal rates with respect to a given chemical etching recipe.

3. The method of claim 1, wherein the removing of the first layer starts a predetermined period of time after the removing of the second layer begins.

4. The method of claim 3, wherein the predetermined period of time corresponds to the time to etch through substantially the entire thickness of the second layer.

5. The method of claim 1, further comprising applying an etch stop layer between the first layer and the second layer prior to the removing of the second layer.

6. The method of claim 1, further comprising:

prior to the etching of the second layer, forming one or more additional pre-metal layers of dielectric material stacked on the second layer; and prior to the etching of the second layer, patterning the one or more additional pre-metal layers.

7. The method of claim 1, wherein the removing of the material of the first layer and the removing of the material of the second layer are performed essentially continuously.

8. The method of claim 1, wherein the forming of the second layer comprises applying dielectric material directly on the first layer without an interlayer dielectric.

9. A method of fabricating a damascene structure with a single exposure, comprising:
- forming a first layer of dielectric material on a surface of a substrate;
- forming a second layer of dielectric material on the first layer;
- patterning a lithographic mask over the second layer to define at least one first cavity in the first layer and at least one second cavity in the second layer;
- removing material from the second layer to form the second cavity as defined by the lithographic mask;
- removing material from the first layer to form the first cavity as defined by the lithographic mask, the first cavity being open to the second cavity, the first cavity extending through the first layer to expose a portion of the surface of the substrate, wherein the removing of material from the first layer is performed such that the first cavity has a smaller width than the second cavity;
- forming a conductor in the first and second cavities, wherein a width of the conductor in the first cavity is smaller than a width of the conductor in the second cavity;
- wherein the removing of material of the second layer is more isotropic than the removing of material of the first layer.

10. A method of fabricating a damascene structure with a single exposure, comprising:
- forming a first layer of dielectric material on a surface of a substrate;
- forming a second layer of dielectric material on the first layer;
- patterning a lithographic mask over the second layer to define at least one first cavity in the first layer and at least one second cavity in the second layer;
- removing material from the second layer to form the second cavity as defined by the lithographic mask;
- removing material from the first layer to form the first cavity as defined by the lithographic mask, the first cavity being open to the second cavity, the first cavity extending through the first layer to expose a portion of the surface of the substrate, wherein the removing of material from the first layer is performed such that the first cavity has a smaller width than the second cavity;
- forming a conductor in the first and second cavities, wherein a width of the conductor in the first cavity is smaller than a width of the conductor in the second cavity;
- wherein the removing of material of the second layer proceeds at a different rate than the removing of material of the first layer.

* * * * *